US008334733B2

(12) United States Patent
Tamura et al.

(10) Patent No.: US 8,334,733 B2
(45) Date of Patent: Dec. 18, 2012

(54) LEFT-HANDED FILTER FOR USE IN MOBILE PHONE PROVIDED WITH WIDE BAND AND IMPROVED PROPAGATION CHARACTERISTICS

(75) Inventors: Masaya Tamura, Osaka (JP); Toshio Ishizaki, Hyogo (JP)

(73) Assignee: Panasonic Corporation, Osaka (JP)

( * ) Notice: Subject to any disclaimer, the term of this patent is extended or adjusted under 35 U.S.C. 154(b) by 497 days.

(21) Appl. No.: 12/680,997

(22) PCT Filed: Sep. 26, 2008

(86) PCT No.: PCT/JP2008/002682
§ 371 (c)(1), (2), (4) Date: Mar. 31, 2010

(87) PCT Pub. No.: WO2009/044518
PCT Pub. Date: Apr. 9, 2009

(65) Prior Publication Data
US 2010/0207706 A1 Aug. 19, 2010

(30) Foreign Application Priority Data
Oct. 1, 2007 (JP) .................................. 2007-257301

(51) Int. Cl.
H03H 7/075 (2006.01)

(52) U.S. Cl. ........................................ 333/168; 333/173

(58) Field of Classification Search ............ 333/167, 333/168, 173, 175, 136, 219, 236
See application file for complete search history.

(56) References Cited

U.S. PATENT DOCUMENTS

| | | | | |
|---|---|---|---|---|
| 1,434,555 | A * | 11/1922 | Martin | 333/168 |
| 1,615,252 | A * | 1/1927 | Zobel | 333/5 |
| 7,391,288 | B1 * | 6/2008 | Itoh et al. | 333/219 |
| 7,446,712 | B2 * | 11/2008 | Itoh et al. | 343/700 MS |
| 7,675,384 | B2 * | 3/2010 | Itoh et al. | 333/118 |
| 7,839,236 | B2 * | 11/2010 | Dupuy et al. | 333/136 |
| 7,952,526 | B2 * | 5/2011 | Lee et al. | 343/700 MS |

(Continued)

FOREIGN PATENT DOCUMENTS

JP 2007-174519 7/2007

(Continued)

OTHER PUBLICATIONS

International Search Report issued Nov. 11, 2008 in International (PCT) Application No. PCT/JP2008/002682.

(Continued)

*Primary Examiner* — Dean O Takaoka
*Assistant Examiner* — Alan Wong
(74) *Attorney, Agent, or Firm* — Wenderoth, Lind & Ponack, L.L.P.

(57) ABSTRACT

A left-handed filter of the present invention includes an interstage coupling element connected to a first capacitor and a ground, a second capacitor connected to the interstage coupling element, a third capacitor connected to the second capacitor, a first inductor connected to the connection point of a fourth capacitor and the second capacitor, and the ground, a second inductor connected to a fifth capacitor and the ground, a first input and output coupling element connected to a sixth capacitor, and a second input and output coupling element connected to the third capacitor. The first and second capacitors, the third and sixth capacitors, the first and second inductors, and third and fourth inductors are respectively arranged in symmetrical positions with respect to an interstage coupling element.

4 Claims, 39 Drawing Sheets

U.S. PATENT DOCUMENTS

2006/0066422 A1    3/2006    Itoh et al.

FOREIGN PATENT DOCUMENTS

JP    2007-235431    9/2007

OTHER PUBLICATIONS

C. Caloz et al., "Novel broadband conventional-and dual-composite right/left-handed (C/D-CRLH) metamaterials: properties, implementation and double-band coupler application", Applied Physics A, Jan. 25, 2007, vol. 87, No. 2, pp. 309-316.

Mitsuhiro Makita et al., "Reflective Bandpass Filter Using Composite Right/Left Handed Transmission Line including Loading Elements Having Periodical Structure", Proceedings of 2006 Chugoku Branch Associated Conference of Electric and Information Related Societies, p. 554, Oct. 21, 2006 along with an English translation.

International Preliminary Report on Patentability issued May 14, 2010 in International (PCT) Application No. PCT/JP2008/002682.

* cited by examiner

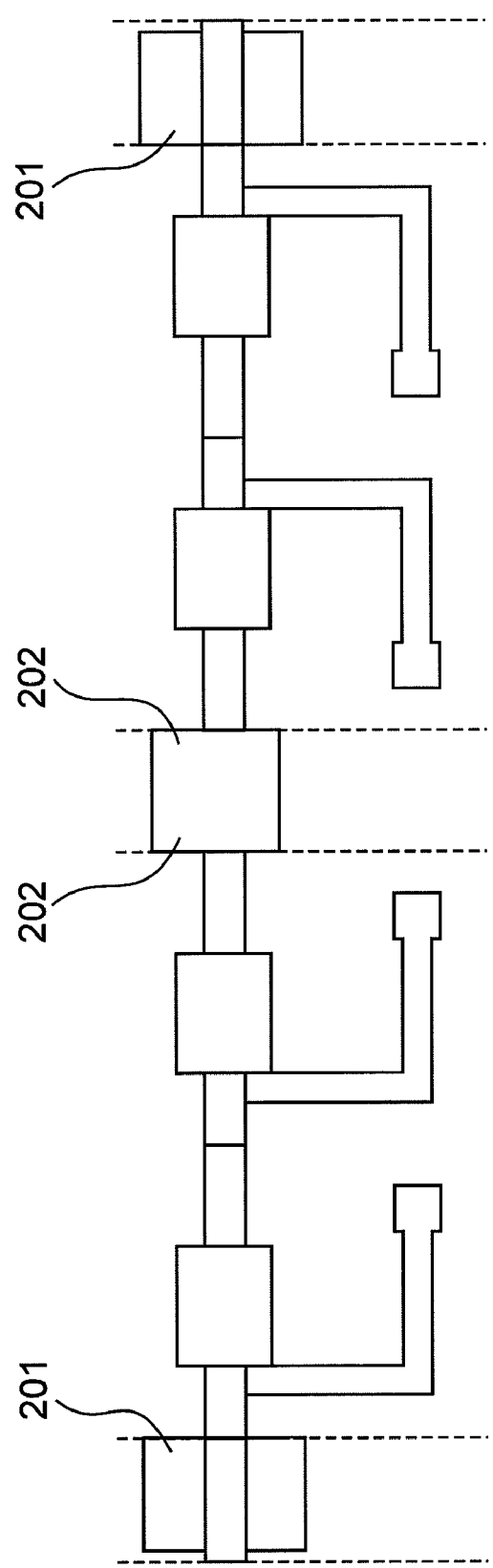

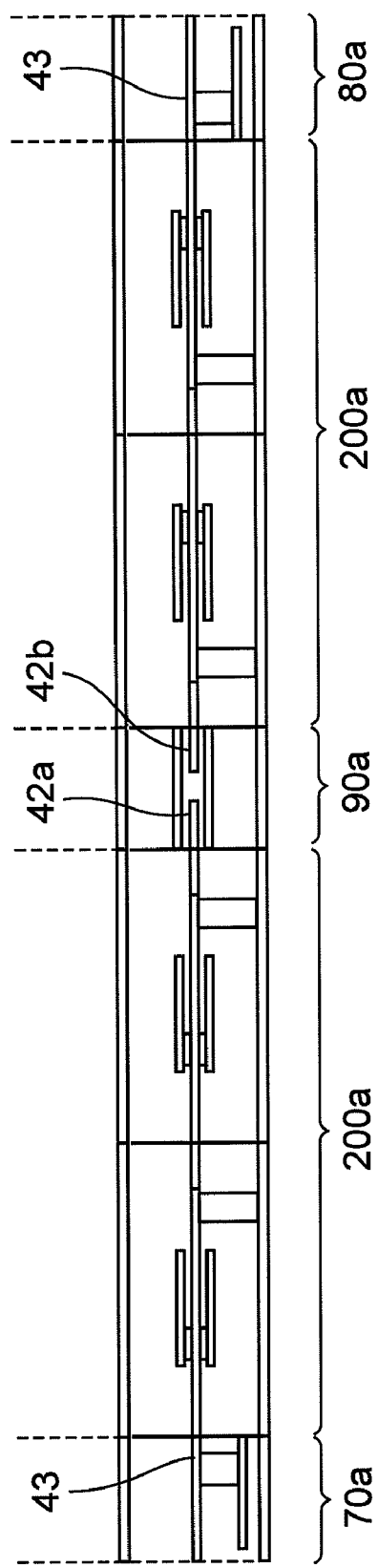

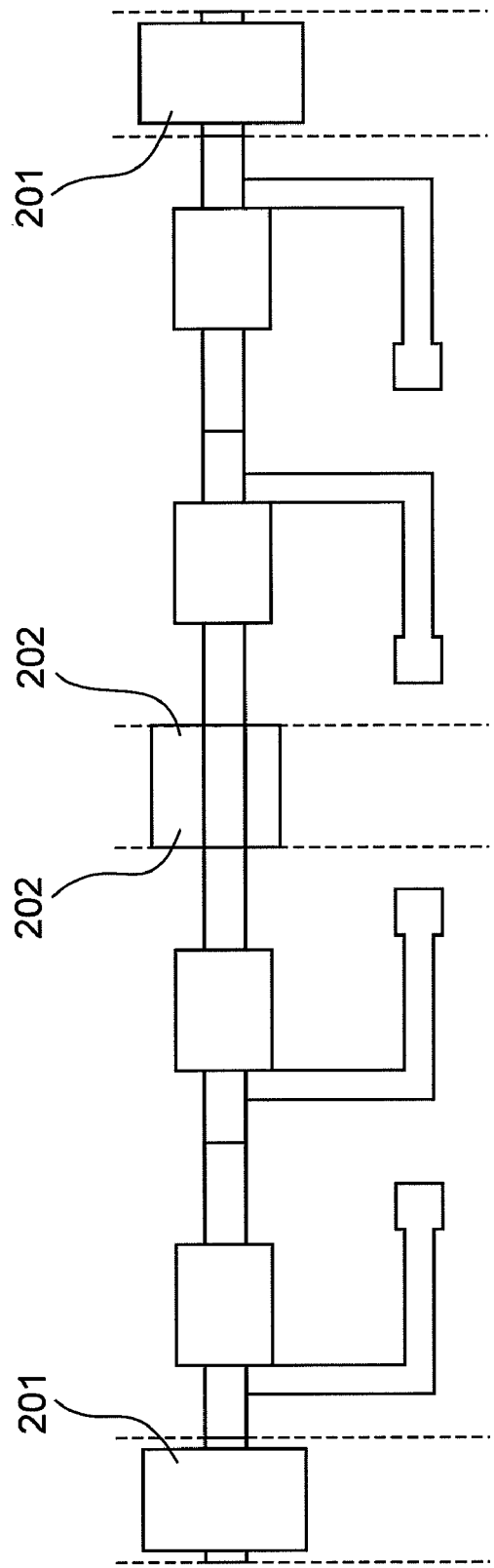

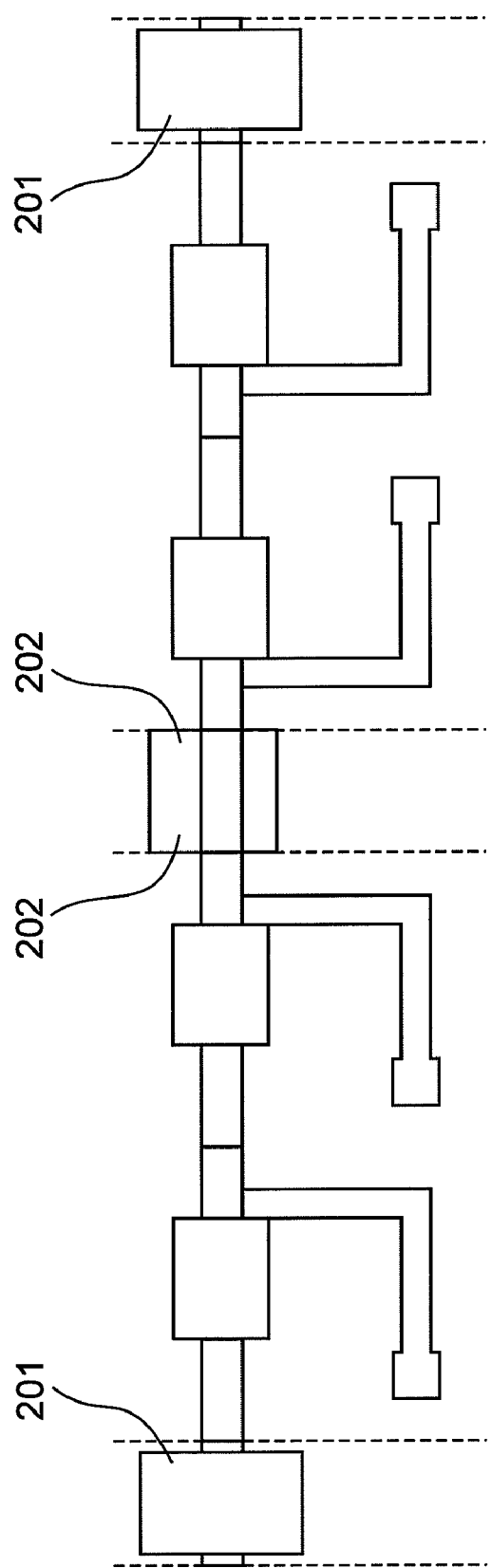

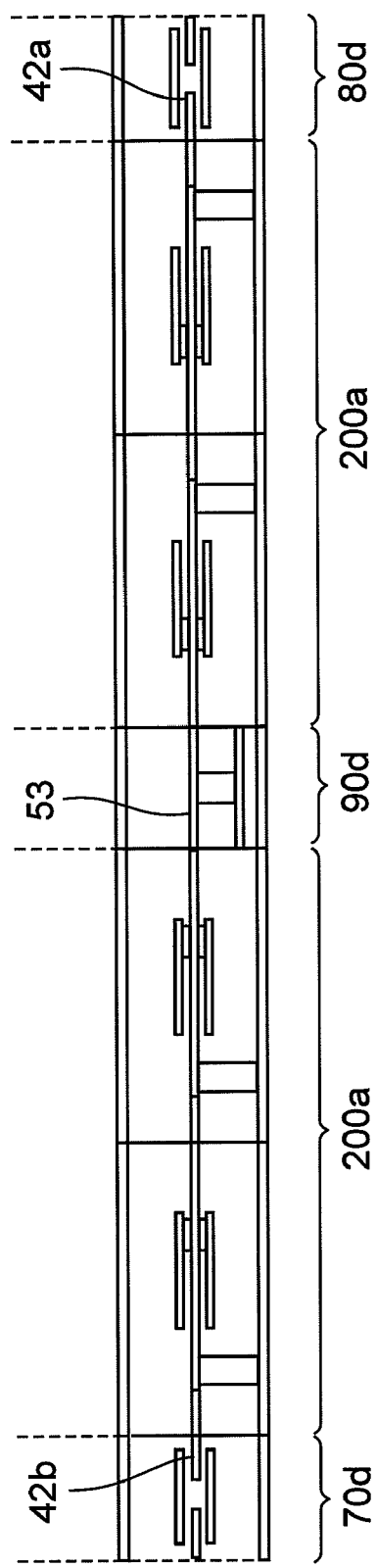

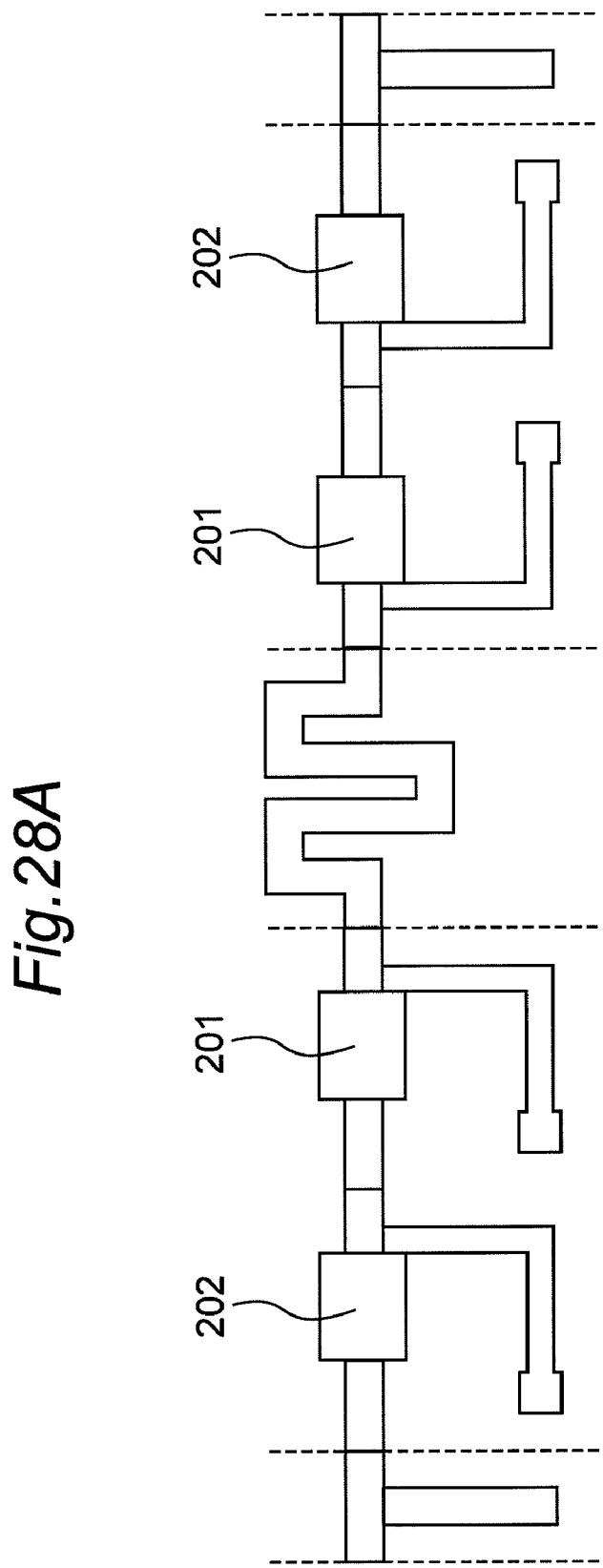

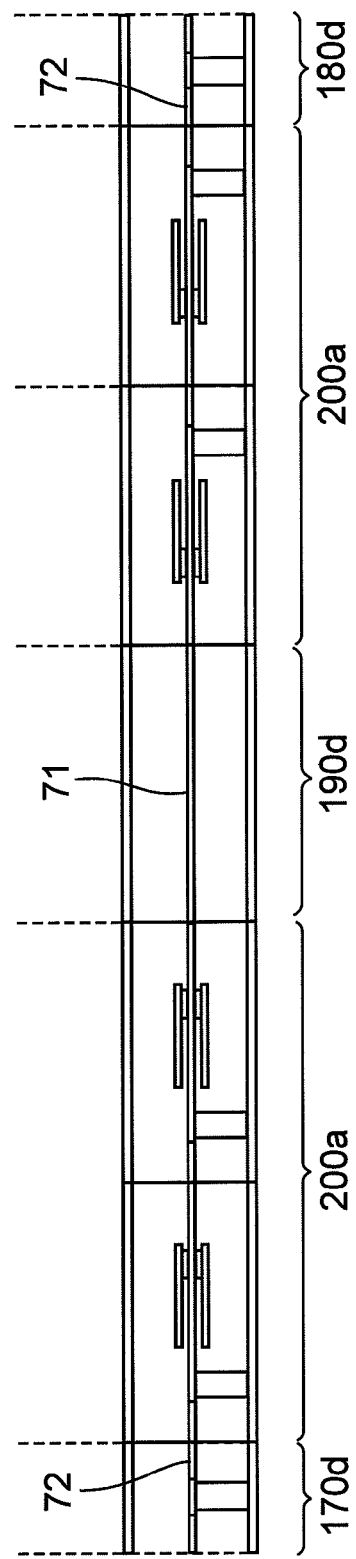

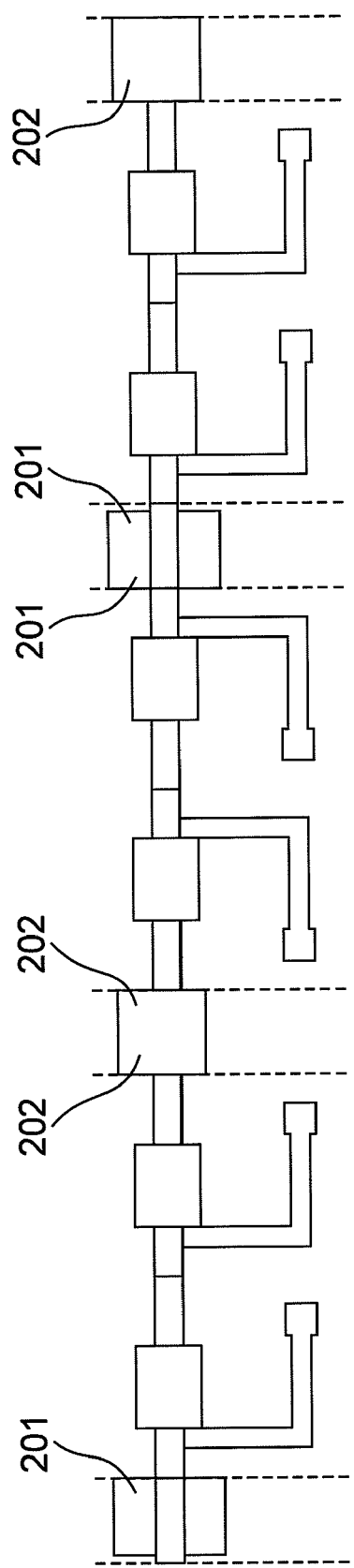

LEFT-HANDED FILTER FOR USE IN MOBILE PHONE PROVIDED WITH WIDE BAND AND IMPROVED PROPAGATION CHARACTERISTICS

TECHNICAL FIELD

The present invention relates to a left-handed filter for use in, for example, a mobile phone or the like.

BACKGROUND ART

Conventionally, as shown in FIG. 35, a left-handed filter of this kind has been constituted by forming on a dielectric layer a so-called left-handed transmission line in which a plurality of inductors 4 and capacitors 3 connected to the ground are alternately connected together, and input and output coupling elements 30a and 30b are connected at both ends. For example, a Patent Document 1 listed below has been known as prior art document information about the present application.

Patent Document 1: Specification of U.S. Patent Application Publication No. US 2006/0066422 A1.

DISCLOSURE OF INVENTION

Problems to be Solved

Such a prior art left-handed filter has had the problem of inferior propagation characteristics. That is, since the resonance frequency is determined by the length of the transmission line and only the signal in the resonance frequency region is made to pass in the aforementioned prior art configuration, a single peak characteristic of a very narrow bandwidth results as shown in FIG. 36, and the propagation characteristics have been consequently worsened.

Accordingly, it is an object of the present invention to provide a left-handed filter, of which the bandwidth can be widened in comparison with the prior art and the propagation characteristics can be improved.

Means for Solving the Problems

In this case, in order to achieve the above-mentioned objective, a left-handed filter includes first, second, third and fourth capacitors, first, second, third and fourth inductors, an interstage coupling element, and first and second input and output coupling elements. The second capacitor has one end connected to one end of the first capacitor, and the first inductor has one end connected to a connection point of the first capacitor and the second capacitor, and another end connected to a ground. The second inductor has one end connected to another end of the second capacitor and another end connected to the ground, and the interstage coupling element has one end connected to another end of the first capacitor and another end connected to the ground. The third capacitor has one end connected to one end of the interstage coupling element, and the fourth capacitor having one end connected to another end of the third capacitor. The third inductor has one end connected to a connection point of the third capacitor and the fourth capacitor, and another end connected to the ground, and the fourth inductor has one end connected to another end of the fourth capacitor and another end connected to the ground. The first input and output coupling element is connected to another end of the second capacitor, and the second input and output coupling element connected to another end of the fourth capacitor. The first capacitor and the third capacitor are arranged in symmetrical positions with respect to the interstage coupling element, and the second capacitor and the fourth capacitor are arranged in symmetrical positions with respect to the interstage coupling element. The first inductor and the third inductor are arranged in symmetrical positions with respect to the interstage coupling element, and the second inductor and the fourth inductor are arranged in symmetrical positions with respect to the interstage coupling element.

Effect of the Invention

With this arrangement, a configuration that passes signals in a plurality of resonance frequency regions is achieved by coupling the resonant modes of the first resonator configured to include the first and second capacitors and the first and second inductors with the second resonator configured to include the third and fourth capacitors and the third and fourth inductors, and it can widen the bandwidth therefore allowing the propagation characteristics of the left-handed filter to be improved.

BRIEF DESCRIPTION OF DRAWINGS

FIG. 15A is a top view showing a structure of the left-handed filters of the first and ninth preferred embodiments of the present invention;

FIG. 15B is a side view showing a structure of the left-handed filters of the first and ninth preferred embodiments of the present invention;

FIG. 18A is a top view showing a structure of the left-handed filter of the second preferred embodiment of the present invention;

FIG. 20A is a top view showing a structure of the left-handed filter of the fourth preferred embodiment of the present invention;

FIG. 20B is a side view showing a structure of the left-handed filter of the fourth preferred embodiment of the present invention;

FIG. 28A is a top view showing a structure of the left-handed filter of the eighth preferred embodiment of the present invention;

FIG. 28B is a side view showing a structure of the left-handed filter of the eighth preferred embodiment of the present invention;

FIG. 30A is a top view showing a structure of the left-handed filter of the ninth preferred embodiment of the present invention;

Figure 1:
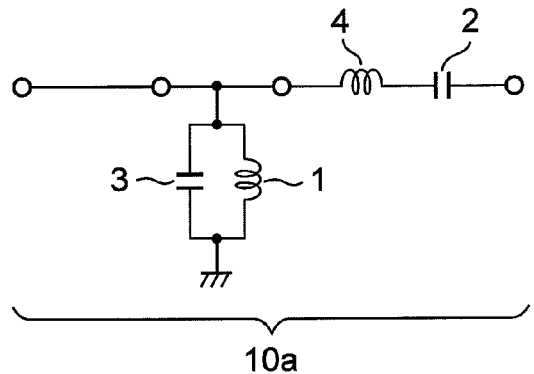
FIG. 1 is an equivalent circuit diagram showing a unit cell in a left-handed filter according to a first preferred embodiment of the present invention.

REFERENCE NUMERICALS 1, 4, 11, 14: Inductor
2, 3, 12, 13: Capacitor 7a, 7b, 7c, 7d, 76: Input coupling capacitor
8a, 8b, 8c, 8d, 79: Output coupling capacitor
9a, 9b, 9c, 9d, 77, 78: Interstage coupling capacitor
10a, 10b: Unit cell
17a, 17b, 17c, 17d: Input coupling inductor
18a, 18b, 18c, 18d: Output coupling inductor
19a, 19b, 19c, 19d: Interstage coupling inductor
20a: Structural example of unit cell
21, 22a, 22b, 23, 24, 25, 26a, 26b, 31, 32a, 32b, 33, 34, 35, 36a, 36b: Conductor
27, 28: Grounding conductor
29: Dielectric
30a: Input coupling element
30b: Output coupling element
41a, 41b, 42a, 42b, 43, 44, 45, 51a, 51b, 52a, 52b, 53, 54, 55, 61, 62, 63, 64a, 64b, 65a, 65b, 66, 71, 72, 73, 74: Conductor
70a, 70b, 70c, 70d, 86: Structural example of input coupling capacitor
80a, 80b, 80c, 80d, 89: Structural example of output coupling capacitor
90a, 90b, 90c, 90d, 87, 88: Structural example of interstage coupling capacitor
100a: CRLH resonator
101, 102: Terminal
170a, 170b, 170c, 170d: Structural example of input coupling inductor
180a, 180b, 180c, 180d: Structural example of output coupling inductor
190a, 190b, 190c, 190d: Structural example of interstage coupling inductor
200a: Structural example of CRLH resonator
201, 202: Terminal

BEST MODE FOR CARRYING OUT THE INVENTION

First Preferred Embodiment

A left-handed filter according to the first preferred embodiment of the present invention is described below with reference to the drawings.

First of all, a circuit that is called a unit cell 10a used in the present invention is shown in FIG. 1. The unit cell 10a is constituted by including inductors 1 and 4 and capacitors 2 and 3. In detail, the inductor 1 is connected in parallel with the capacitor 3 and grounded on one end side. Then, one end of the inductor 4 is connected to another end side, and the capacitor 2 is connected in series to another end of the inductor 4. It is noted that the order of connection of the inductor 4 and the capacitor 2 may be reversed.

Figure 11A:
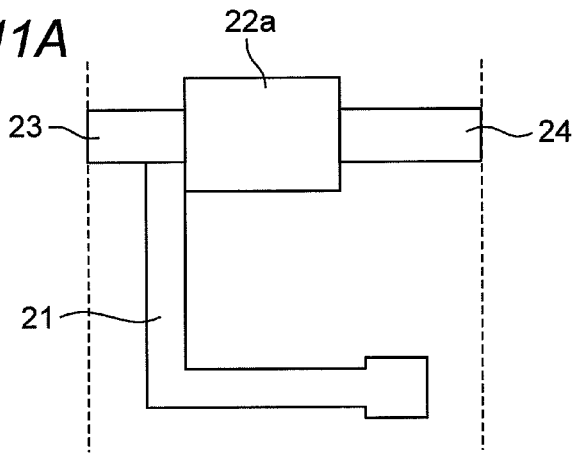
FIG. 11A is a top view showing a unit cell structure in the left-handed filter of the first preferred embodiment of the present invention.
Figure 11B:
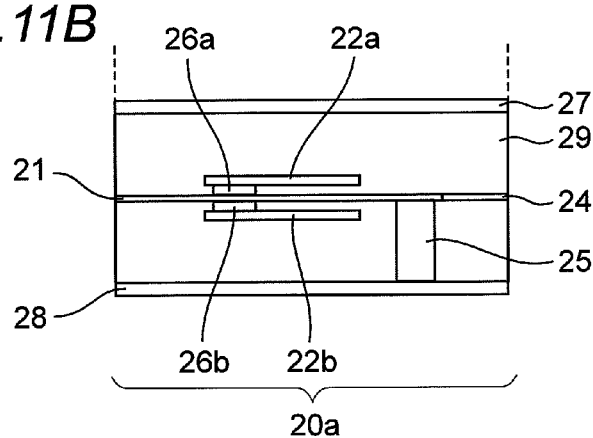
FIG. 11B is a side view showing a terminal cell structure in the left-handed filter of the first preferred embodiment of the present invention.

Next, a concrete unit cell structure 20a of the unit cell 10a is shown in FIGS. 11A and 11B. As shown in FIG. 11B, in a structure filled with a dielectric 29 between grounding conductors 27 and 28 arranged to oppose each other, the inductor 1 shown in FIG. 1 is configured to include a conductor 21 and a conductor 25 that connects it to the grounding conductor 28 as shown in FIG. 11B, and the capacitor 2 shown in FIG. 1 is configured to include a structure in which a conductor 24 is held between the conductors 22a and 22b as shown in FIGS. 11A and 11B. The inductor 4 shown in FIG. 1 is configured to include conductors 26a and 26b that electrically connect the conductors 22a and 22b shown in FIG. 11B to the conductor 24 and the conductor 24, and the capacitor 3 shown in FIG. 1 is configured to include the conductors 21 and 23 and the grounding conductors 27 and 28 arranged to oppose each other.

The unit cell 10a shown in FIG. 1 and the unit cell structure 20a shown in FIG. 11 are a composite right/left-handed transmission line called a left-handed metamaterial.

The left-handed metamaterial is described herein. Materials existing in the natural world are normally right-handed media. They have a positive dielectric constant and a positive magnetic permeability. Moreover, the refractive index has a positive value, and we have considered this to be the natural properties of the materials. Regarding already known special media, it has been known that the apparent magnetic permeability becomes negative in plasma and electromagnetic waves cannot propagate in the plasma, and the apparent magnetic permeability becomes negative in ferrite and electromagnetic waves cannot propagate in the ferrite. Although the media of which both the dielectric constant and the magnetic permeability become concurrently negative has not been discovered in the natural world up to now, it can be derived that electromagnetic waves can propagate in such media and the refractive index becomes negative by consideration with reverting to the Maxwell equations.

Such a medium is an artificial medium (metamaterial) of which the apparent material property values are controlled by artificially elaborating a fine structure. A variety of methods can be considered as an implementation method of the metamaterial, and artificial crystals, transmission line types and so on have been proposed so far. It is herein noted that the right-handed system and the left-handed system depend on whether the direction of the electric field of electromagnetic waves, the direction of magnetic fields and the direction (phase transmission direction) in which the waves advance conform to the positional relations of the thumb, the forefinger and the middle finger are of the right hand or the left hand. That is, the phase transmission direction of electromagnetic waves is reversed between the right-handed system and the left-handed system. The phase also propagates in the energy transmission direction of waves in the right-handed system, whereas the phase propagates in the opposite direction with respect to the energy transmission direction of waves in the left-handed system. Therefore, the transmission of electromagnetic waves forms a backward traveling wave, and the energy transmission direction and the phase transmission direction are in mutually opposite directions in a left-handed system medium.

Figure 31:
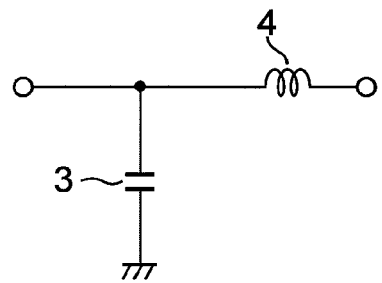
FIG. 31 is an equivalent circuit diagram of a right-handed transmission line in the left-handed filter of the first preferred embodiment of the present invention.
Figure 32:
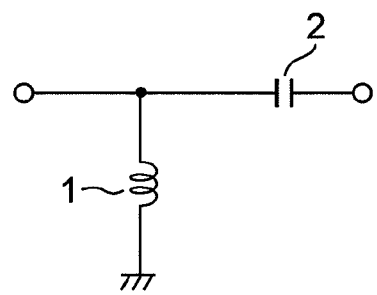
FIG. 32 is an equivalent circuit diagram of a left-handed transmission line in the left-handed filter of the first preferred embodiment of the present invention.

The principle of operation of the transmission line type metamaterial is described in detail below. Referring to FIG. 31, the transmission line of the ordinary right-handed system can be considered by an equivalent circuit such that infinite numbers of infinite minute intervals configured to include series inductors 4 and parallel capacitors 3 are connected together in order to express its electrical characteristics. The structure is the pure right-handed transmission line (Pure right-handed transmission line; PRH TL). In contrast to this, as shown in FIG. 32, the transmission line of the left-handed system can be considered by an equivalent circuit such that infinite numbers of infinite minute intervals configured to include series capacitors 2 and parallel inductors 1 are connected together. The structure becomes the pure left-handed transmission line (Pure left-handed transmission line; PLH TL), which is unfortunately infeasible. This is because a series capacitor has a size when it is subjected to trial production, and therefore, a parasitic series inductor of the right-handed system is inevitably generated. Moreover, a parallel inductor has a size when it is subjected to trial production, and therefore, a parasitic parallel capacitor of the right-handed system is inevitably generated. Therefore, actually feasible one is a composite right/left-handed transmission line (Composite right/left-handed transmission line; CRLH TL) that is configured to include a left-handed capacitor and a right-handed capacitor in series and a left-handed inductor and a right-handed capacitor in parallel. This corresponds to the unit cell 10a shown in FIG. 1.

The CRLH transmission line has the properties of both the left-handed system and the right-handed system. It has the property of the right-handed system in a high-frequency region and has the property of the left-handed system in a low-frequency region. The left-handed capacitor $C_L$ and the right-handed inductor $L_R$ in series form a series resonant circuit, which resonates at an angular frequency $\omega_{se}=1/(C_L \times L_R)$.

The left-handed inductor $L_L$ and the right-handed capacitor $C_R$ in parallel form a parallel resonant circuit, which anti-resonates at an angular frequency $\omega_{sh}=1/(L_L \times C_R)$. A case where $\omega_{se}=\omega_{sh}$ is called a balance case, in which the frequency domain of the right-handed system and the frequency domain of the left-handed system are continuously connected. A case where $\omega_{se} \neq \omega_{sh}$ is called an unbalance case, in which a gap is generated between the frequency domain of the right-handed system and the frequency domain of the left-handed system, and it becomes an attenuation band where electromagnetic waves cannot propagate. The aforementioned reference document utilizes a zeroth-order mode resonance generated at the boundary frequency between the frequency domain of the right-handed system and the frequency domain of the left-handed system.

Figure 33:
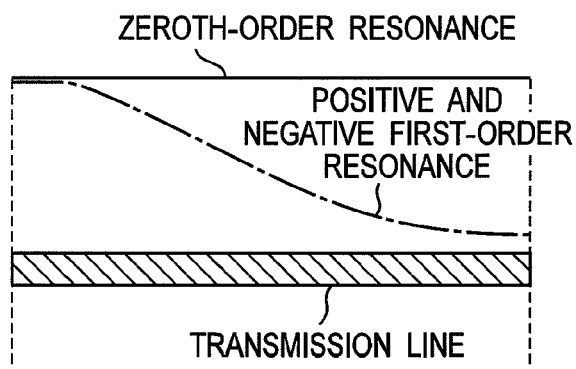
FIG. 33 is a characteristic chart showing a voltage standing wave of the CRLH resonator in the left-handed filter of the first preferred embodiment of the present invention.
Figure 36:
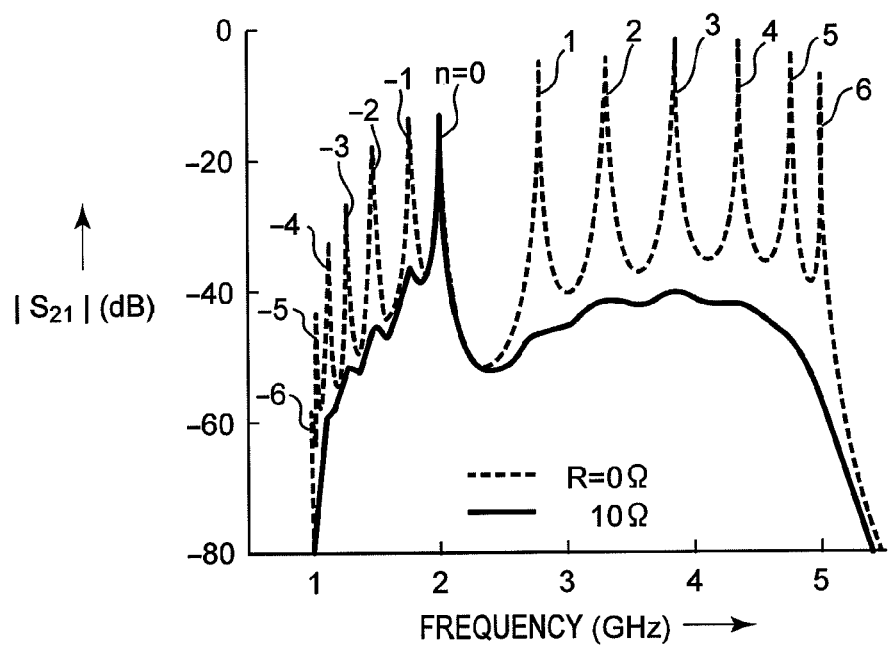
FIG. 36 is a frequency characteristic chart of the prior art left-handed filter.

When a minute gap or the like is constructed to form an input and output coupling capacitance at the input and output terminals of the CRLH transmission line, the CRLH operates as a resonator in a manner similar to that of a finite length line of the right-handed system. In the finite length line resonator of the right-handed system, a resonance of the lowest order corresponding to half wavelengths and a resonance of higher harmonics being the integral multiples of it are observed. In contrast to this, the number of inherent resonance frequencies is determined depending on the number of cells in the CRLH resonator. For example, in the case of the cell number n=7 when seven unit cells 10a are connected together, a positive first-order resonance to a positive sixth-order resonance on which the standing wave of half wavelengths is superimposed exist as resonances of the right-handed system as shown in FIG. 36. Moreover, regarding resonances of backward traveling waves, a negative first-order resonance to a negative sixth-order resonance on which the standing wave of half wavelengths is superimposed exist as resonances of the left-handed system. Further, a zeroth-order mode in which all the cells vibrate in synchronism at an identical electric potential exists. As shown in FIG. 33, no standing wave appears in the zeroth-order mode, and this mode can be considered as a special resonant mode in which the wavelength becomes infinite.

In the CRLH resonator, the positive first-order and negative first-order resonant modes are the same when the standing wave distribution is observed as shown in FIG. 33, and since the absolute values of the phase velocities of the forward traveling wave of the right-handed system and the backward traveling wave of the left-handed system become identical at a low frequency in the left-handed system, the resonant frequency of the left-handed system is surely lowered.

At a frequency lower than the negative sixth order, the high-path characteristics of the CRLH transmission line become effective, providing a left-handed gap that inhibits transmission at a frequency lower than the frequency. At a frequency higher than the positive sixth order, the low-path characteristic of the CRLH transmission line becomes effective, providing a right-handed gap that inhibits transmission at a frequency higher than the frequency. Therefore, the CRLH resonator provides a very wide-band band-pass characteristic including the low-frequency left-handed system region and the high-frequency right-handed system region. However, the present invention does not intend to utilize the wide-band band-pass characteristic including both of the left-handed system and the right-handed system. The present invention is a micro-miniature band-pass left-handed filter utilizing the slow-wave characteristic of the backward traveling wave of the left-handed system.

In order to constitute a band-pass left-handed filter having the desired bandwidth by using the resonance of the left-handed system, it is necessary to collect a plurality of certain specific left-handed resonant modes and form a band-pass characteristic. For the above purpose, a multistage left-handed filter having a plurality of resonators is constituted by using an interstage coupling element according to the configuration of the present invention.

It should be noted herein that the resonant modes are able to have only isolated resonance frequencies having specific frequency intervals corresponding to the number of discrete standing waves even if, for example, adjoining negative first-order and negative second-order resonant modes are utilized in a resonator in one stage.

Figure 34:
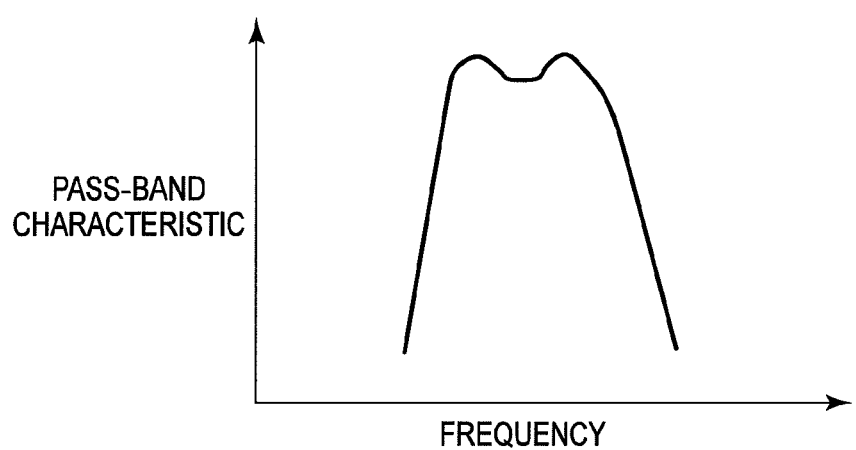
FIG. 34 is a left-handed filter characteristic chart of the left-handed filter of the first preferred embodiment of the present invention.
Figure 35:
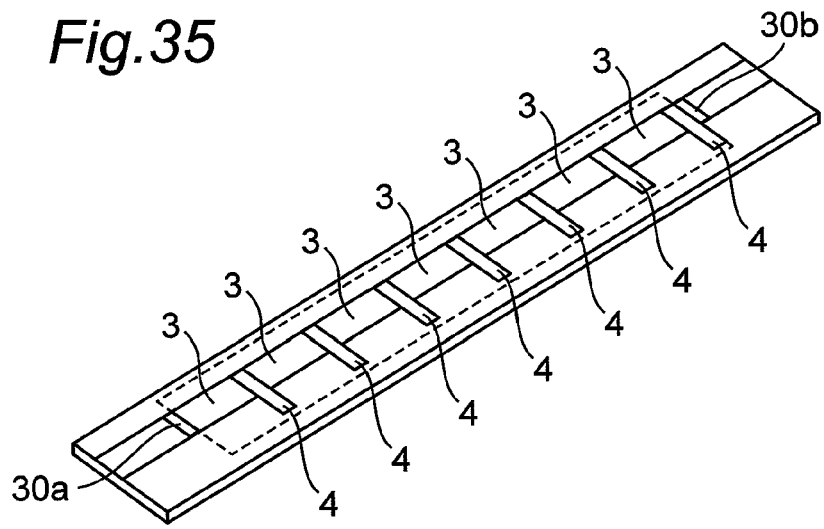
FIG. 35 is a perspective view of a prior art left-handed filter.

In contrast to this, when, for example, a two-stage left-handed filter is constituted by using an interstage coupling element, a pass-band can be formed by using the negative first-order resonant mode of a first resonator and the negative first-order resonant mode of a second resonator as shown in FIG. 34. In the case, the desired bandwidth and pass-band characteristic can be formed by controlling the sizes of the interstage coupling element and the input and output coupling element for the bandwidth. This point is a feature of the present invention.

The configuration is described in detail below.

Figure 2:
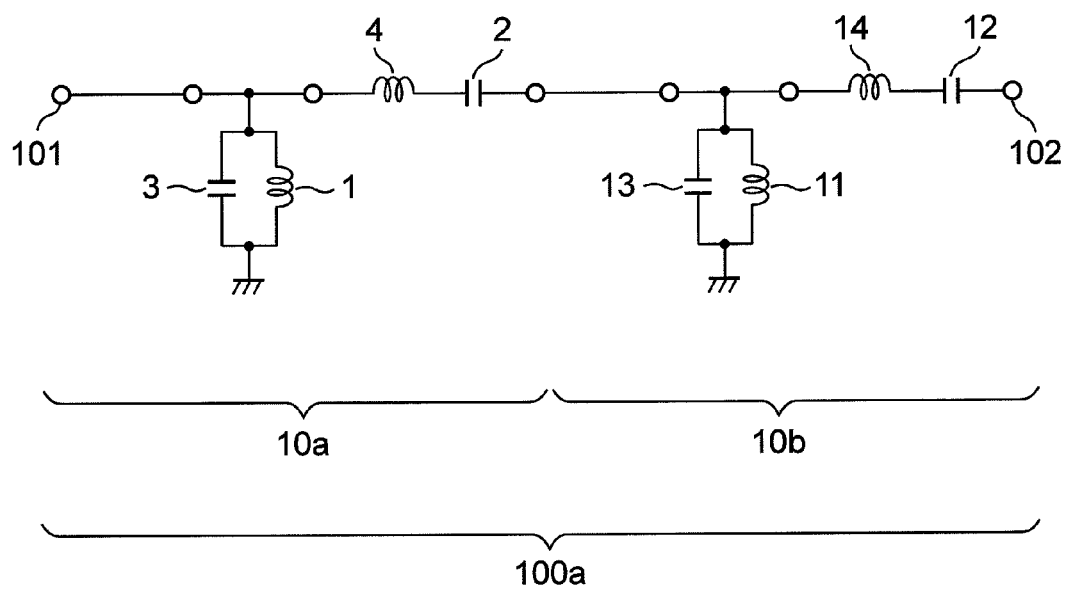
FIG. 2 is an equivalent circuit diagram showing a CRLH resonator in the left-handed filter of the first preferred embodiment of the present invention.

As shown in FIG. 2, a circuit, in which a unit cell 10a, and a unit cell 10b that is configured to include inductors 11 and 14 and capacitors 12 and 13 in a manner similar to that of the unit cell 10a are connected in series, is a CRLH resonator 100a.

Since the CRLH resonator 100a has the unit cells 10a and 10b, there are three resonances of the negative first-order, the zeroth-order and the first-order.

In the CRLH resonator 100a, it is assumed that the side where the inductor 1 and the capacitor 3 are connected in parallel serves as a terminal 101 and the side where the inductor 14 and the capacitor 12 are connected in series serves as a terminal 102.

Figure 12A:
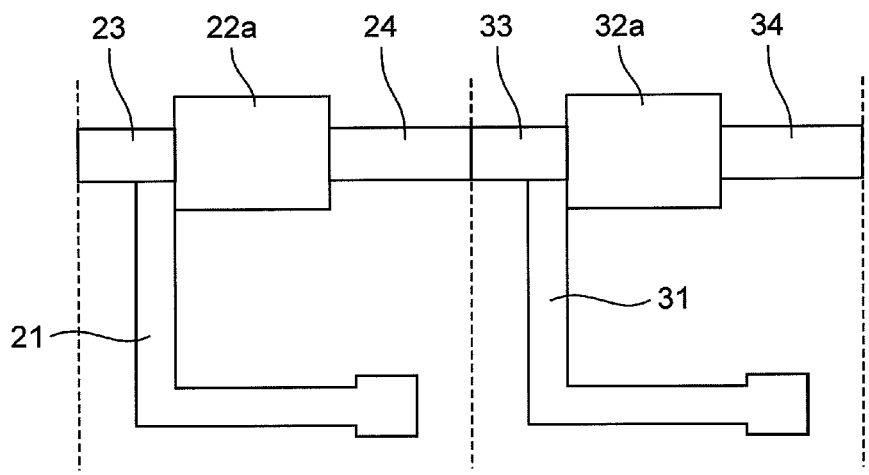
FIG. 12A is a top view showing a structure of a CRLH resonator in the left-handed filter of the first preferred embodiment of the present invention.
Figure 12B:
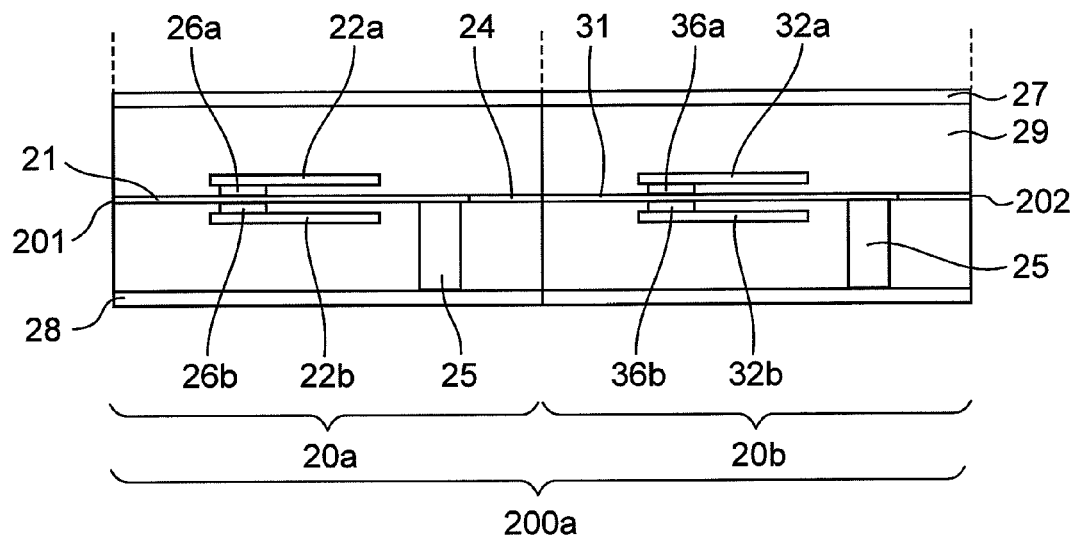
FIG. 12B is a side view showing a structure of the CRLH resonator in the left-handed filter of the first preferred embodiment of the present invention.

As shown in FIGS. 12A and 12B, for example, the CRLH resonator 100a is configured by a series connection constituted by including a unit cell structure 20a and a unit cell structure 20b configured, in a structure filled with a dielectric 29 between grounding conductors 27 and 28 arranged to oppose each other in a manner similar to that of the unit cell structure 20a, by constituting the inductor 11 shown in FIG. 2 of a conductor 31 and a conductor 35 that connects it with the grounding conductor 28, constituting the capacitor 12 shown in FIG. 2 of a structure sandwiching a conductor 34 between conductors 32a and 32b, constituting the inductor 14 shown in FIG. 2 of conductors 36a and 36b that electrically connect the conductors 32a and 32b with the conductor 34 and the conductor 34, and constituting the capacitor 13 of a space between the grounding conductors 27 and 28 arranged mutually facing the conductors 31 and 32. This is assumed to be a CRLH resonator structure 200a. The terminal 101 shown in FIG. 2 corresponds to a terminal 201 in FIG. 12B, and the terminal 102 shown in FIG. 2 corresponds to a terminal 202 in FIG. 12B.

Figure 3:
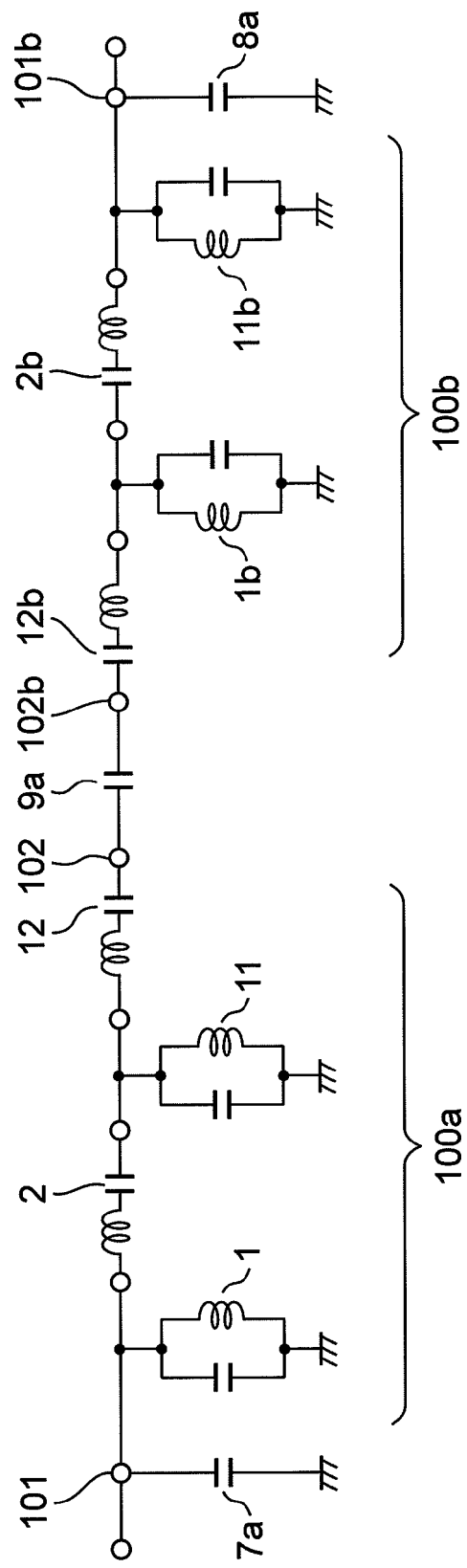
FIG. 3 is an equivalent circuit diagram of the left-handed system of the first preferred embodiment of the present invention.

Then, the configuration of the left-handed filter according to the first preferred embodiment of the present invention is described herein. As shown in FIG. 3, an input coupling capacitor 7a is connected between the terminal 101 of the CRLH resonator 100a and the grounding plane, and an interstage coupling capacitor 9a is connected in series to the terminal 102 of the CRLH resonator 100a. Further, the interstage coupling capacitor 9a and the terminal 102 of a newly prepared CRLH resonator 100b are connected in series, and an output coupling capacitor 8a is connected between a terminal 101b of the CRLH resonator 100b and a grounding plane. That is, the configuration includes a first capacitor 12b, a second capacitor 2b whose one end is connected to one end of the first capacitor 12b, a first inductor 1b whose one end is connected to the connection point of the first capacitor 12b and the second capacitor 2b, and another end is connected to the ground, a second inductor 11b whose one end is connected to another end of the second capacitor 2b and another end is connected to the ground, an interstage coupling capacitor 9a served as an interstage coupling element whose one end is connected to another end of the first capacitor 12b, a third capacitor 12 whose one end is connected to another end of the interstage coupling capacitor 9a, a fourth capacitor 2 whose one end is connected to another end of the third capacitor 12, a third inductor 11 whose one end is connected to the connection point of the third capacitor 12 and the fourth capacitor 2, and another end is connected to the ground, a fourth inductor 1 whose one end is connected to another end of the fourth capacitor 2 and another end is connected to the ground, a first input and output coupling element 8a whose one end is connected to another end of the second capacitor 2b and another end is connected to the ground, and a second input and output coupling element 7a whose one end is connected to another end of the fourth capacitor 2 and another end is connected to the ground. The first capacitor 12b and the third capacitor 12 are arranged in symmetrical positions with respect to the interstage coupling capacitor 9a, and the second capacitor 2b and the fourth capacitor 2 are arranged in symmetrical positions with respect to the interstage coupling capacitor 9a. The first inductor 1b and the third inductor 11 are arranged in symmetrical positions with respect to the interstage coupling capacitor 9a, and the second inductor 11b and the fourth inductor 1 are arranged in symmetrical positions with respect to the interstage coupling capacitor 9a.

Since the CRLH resonators 100a and 100b are arranged in symmetrical positions with respect to the interstage coupling capacitor 9a as described above, coupling of the negative first-order resonances of the two CRLH resonators 100a and 100b can be easily controlled to allow the left-handed filter whose pass-band is formed of the negative first-order resonance to be constructed, and the left-handed filter compacter than the prior art two-stage left-handed filter can be provided by virtue of using the negative first order.

Figure 13A:
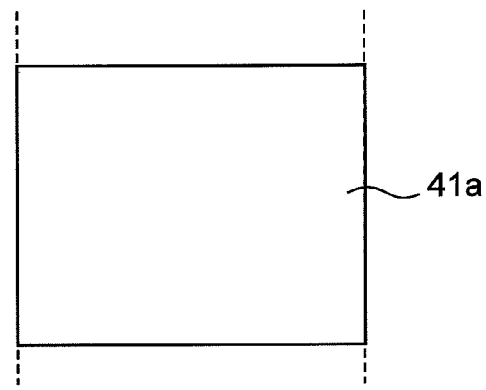
FIG. 13A is a top view showing a structure of an interstage coupling capacitor in the left-handed filters of the first, third and ninth preferred embodiments of the present invention.
Figure 13B:
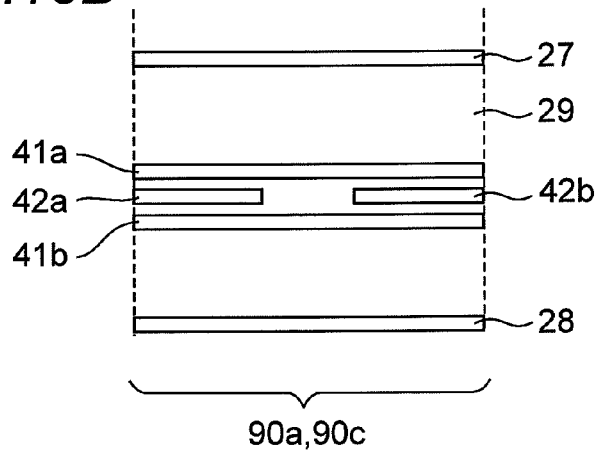
FIG. 13B is a side view showing a structure of the interstage coupling capacitor in the left-handed filters of the first, third and ninth preferred embodiments of the present invention.
Figure 14A:
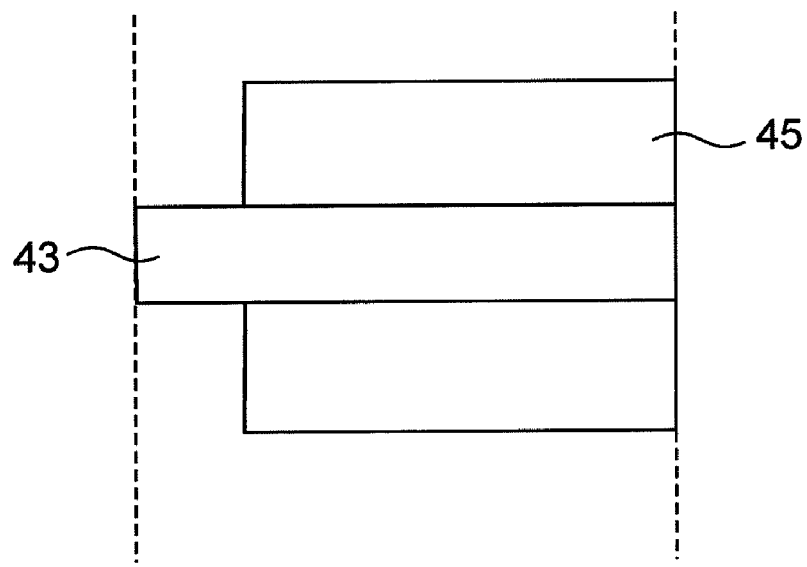
FIG. 14A is a top view showing a structure of an input coupling capacitor and an output coupling capacitor in the left-handed filters of the first and third preferred embodiments of the present invention.
Figure 14B:
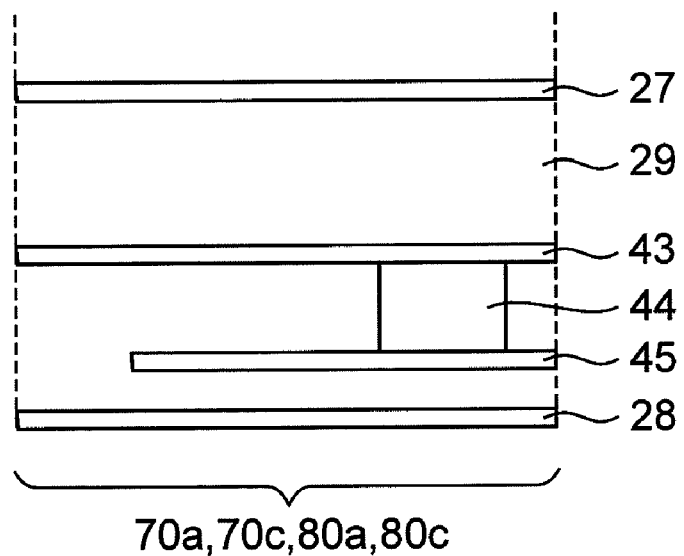
FIG. 14B is a side view showing a structure of the input coupling capacitor and the output coupling capacitor in the left-handed filters of the first and third preferred embodiments of the present invention.

As a concrete configuration, in the structure filled with a dielectric 29 between the grounding conductors 27 and 28 arranged to oppose each other as shown in FIGS. 13A and 13B, the interstage coupling capacitor 9a shown in FIG. 3 is constituted by sandwiching the conductors 42a and 42b shown in FIGS. 13A and 13B between conductors 41a and 41b, and this is served as the interstage coupling capacitor structure 90a. Moreover, in the structure filled with the dielectric 29 between the grounding conductors 27 and 28 arranged to oppose each other as shown in FIGS. 14A and 14B, the input coupling capacitor 7a shown in FIG. 3 is constituted by including a structure provided by connecting a conductor 44 to a conductor 43 and connecting a conductor 45 to it to thereby shorten a distance to the grounding conductor 28, and this is served as an input coupling capacitor structure 70a. The output coupling element 8a shown in FIG. 3 is also constituted by including a structure similar to that of the input coupling capacitor structure 70a, and this is served as an output coupling capacitor structure 80a. Then, as shown in FIGS. 15A and 15B, the concrete configuration of the left-handed filter described in the present preferred embodiment is configured by connecting the terminal 201 of a CRLH resonator structure 200a with the conductor 43 of the input coupling capacitor structure 70a, connecting the conductor 42b of the interstage coupling capacitor structure 90a in series to the terminal 202 of the CRLH resonator structure 200a, further connecting the conductor 42a of the interstage coupling capacitor structure 90a in series to the terminal 202 of a newly prepared CRLH resonator structure 200a and connecting the terminal 201 of the CRLH resonator structure 200a with the conductor 43 of the output coupling capacitor structure 80a.

Although the present preferred embodiment is constituted by including the input coupling capacitor 7a, the output coupling capacitor 8a and the interstage coupling capacitor 9a, a similar effect can be obtained by constituting at least one of them of a capacitor and constituting the other components of an inductor. In this case, since the capacitor can be generally constituted with a low loss, the capacitor is more desirable.

Second Preferred Embodiment

A left-handed filter according to the second preferred embodiment of the present invention is described below with reference to the drawings.

Figure 4:
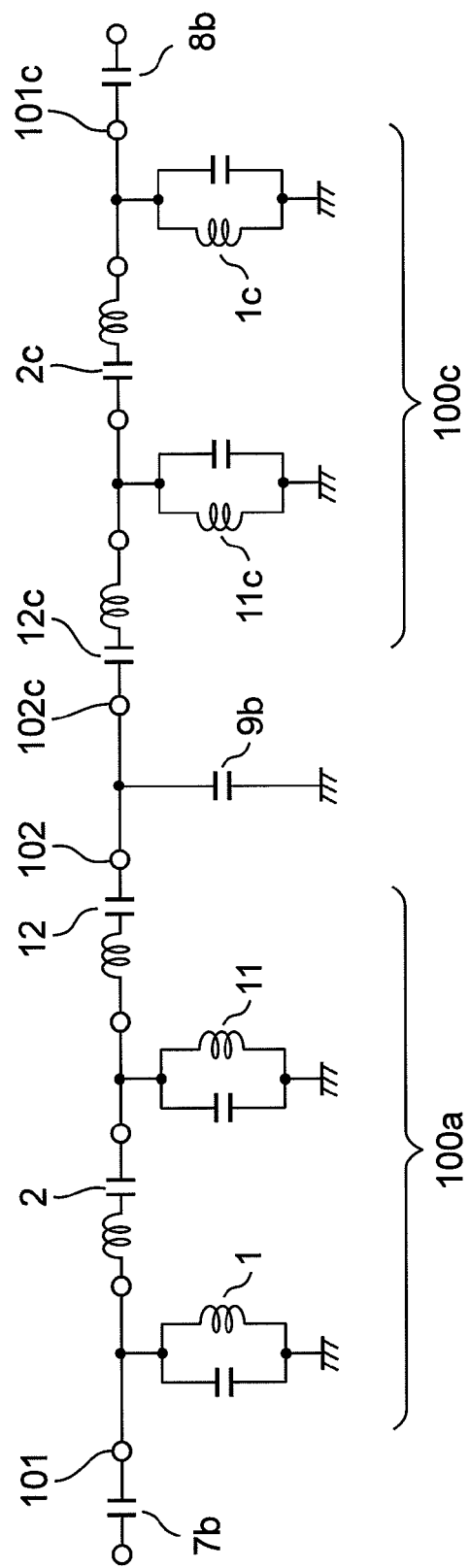
FIG. 4 is an equivalent circuit diagram of a left-handed filter according to a second preferred embodiment of the present invention.

As shown in FIG. 4, the present preferred embodiment is constituted by connecting an input coupling capacitor 7b in series to the terminal 101 of the CRLH resonator 100a described in the first preferred embodiment, connecting an interstage coupling capacitor 9b between the terminal 102 of the CRLH resonator 100a and a grounding plane, connecting a terminal 102c of a newly prepared CRLH resonator 100c to the connection point of the CRLH resonator 100a and the interstage coupling capacitor 9b, and connecting an output coupling capacitor 8b in series to a terminal 101c of the CRLH resonator 100c. That is, the configuration includes a first capacitor 12c, a second capacitor 2c whose one end is connected to one end of the first capacitor 12c, a first inductor 11c whose one end is connected to the connection point of the first capacitor 12c and the second capacitor 2c, and another end is connected to the ground, a second inductor 1c whose one end is connected to another end of the second capacitor 2c and another end is connected to the ground, an interstage coupling capacitor 9b served as an interstage coupling element whose one end is connected to another end of the first capacitor 12c and another end is connected to the ground, a third capacitor 12 whose one end is connected to one end of the interstage coupling capacitor 9b, a fourth capacitor 2 whose one end is connected to another end of the third capacitor 12, a third inductor 11 whose one end is connected to the connection point of the third capacitor 12 and the fourth capacitor 2, and another end is connected to the ground, a fourth inductor 1 whose one end is connected to another end of the fourth capacitor 2 and another end is connected to the ground, a first input and output coupling element 8b connected to another end of the second capacitor 2c, and a second input and output coupling element 7b connected to another end of the fourth capacitor 2. The first capacitor 12c and the third capacitor 12 are arranged in symmetrical positions with respect to the interstage coupling capacitor 9b, and the second capacitor 2c and the fourth capacitor 2 are arranged in symmetrical positions with respect to the interstage coupling capacitor 9b. The first inductor 11c and the third inductor 11 are arranged in symmetrical positions with respect to the interstage coupling capacitor 9b, and the second inductor 1c and the fourth inductor 1 are arranged in symmetrical positions with respect to the interstage coupling capacitor 9b.

Since the CRLH resonators 100a and 100c are arranged in symmetrical positions with respect to the interstage coupling capacitor 9b as described above, coupling of the negative first-order resonances of the two CRLH resonators 100a and 100c can be easily controlled to allow the left-handed filter whose pass-band is formed of the negative first-order resonance to be constructed, and the left-handed filter compacter than the prior art two-stage left-handed filter can be provided by virtue of using the negative first order.

Figure 16A:
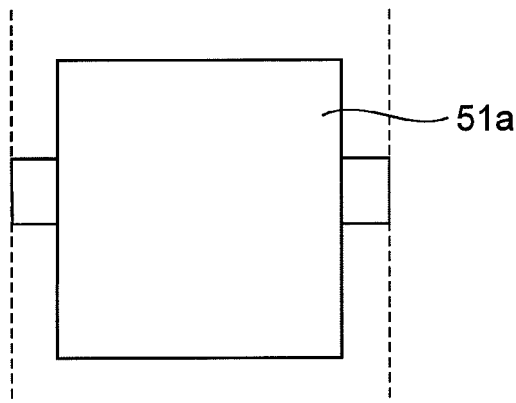
FIG. 16A is a top view showing another structure of an input coupling capacitor and an output coupling capacitor in the left-handed filters of the second and fourth preferred embodiments of the present invention.
Figure 16B:
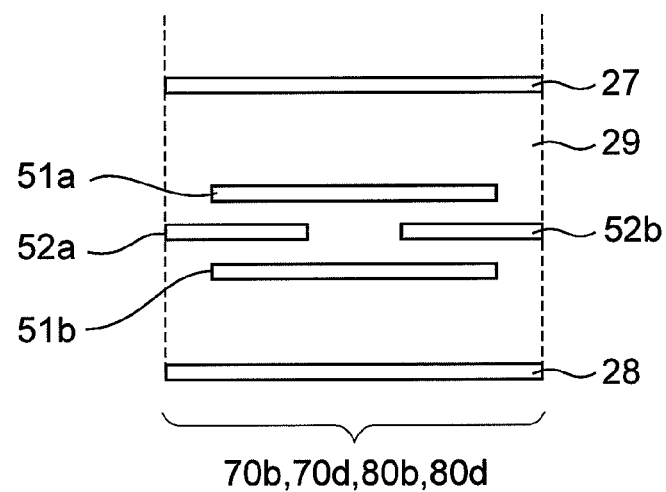
FIG. 16B is a side view showing another structure of the input coupling capacitor and the output coupling capacitor in the left-handed filters of the second and fourth preferred embodiments of the present invention.
Figure 17A:
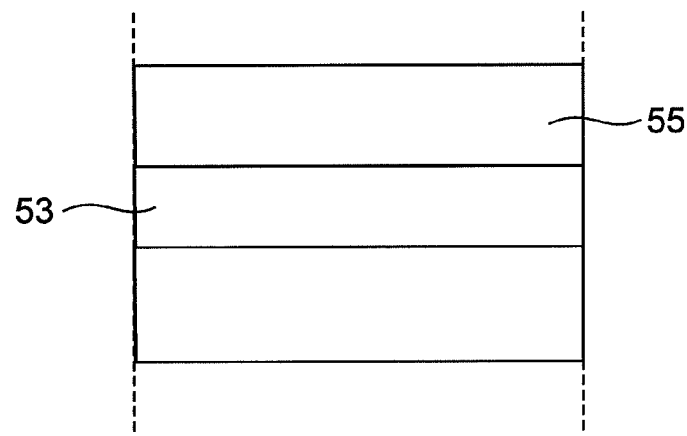
FIG. 17A is a top view showing another structure of an interstage coupling capacitor in the left-handed filters of the second and fourth preferred embodiments of the present invention.
Figure 17B:
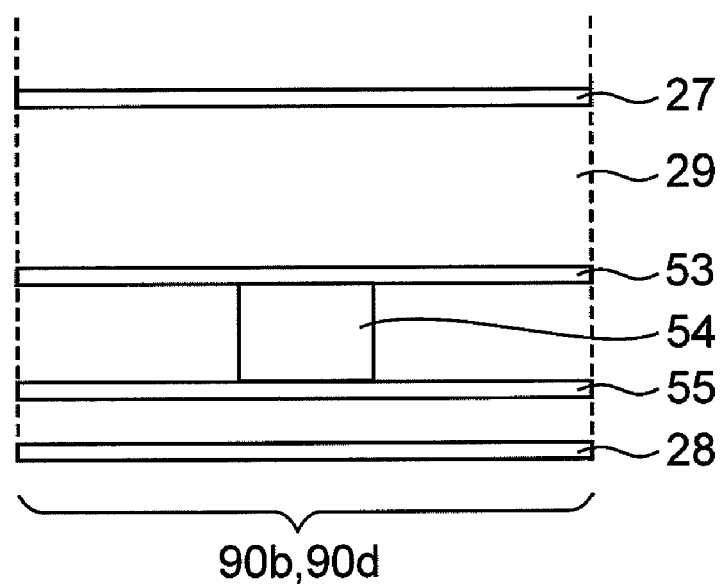
FIG. 17B is a side view showing another structure of the interstage coupling capacitor in the left-handed filters of the second and fourth preferred embodiments of the present invention.
Figure 18B:
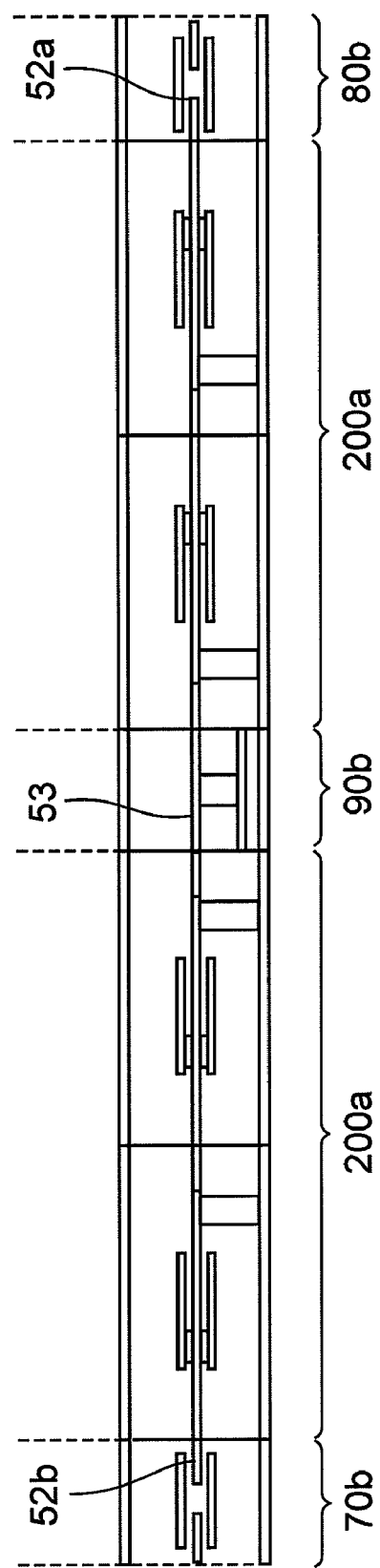
FIG. 18B is a side view showing a structure of the left-handed filter of the second preferred embodiment of the present invention.

A concrete configuration is described below. In the structure filled with a dielectric 29 between grounding conductors 27 and 28 arranged to oppose each other as shown in FIGS. 16A and 16B, the input coupling capacitor 7b shown in FIG. 4 is constituted by sandwiching conductors 52a and 52b shown in FIGS. 16A and 16B between conductors 51a and 52b, and this is served as an input coupling capacitor structure 70b. The output coupling capacitor 8b shown in FIG. 4 is also constituted by including a structure similar to that of the input coupling capacitor structure 70b shown in FIGS. 16A and 16B, and this is served as an output coupling capacitor structure 80b. Moreover, in the structure filled with the dielectric 29 between the grounding conductors 27 and 28 arranged to oppose each other as shown in FIGS. 17A and 17B, the interstage coupling capacitor 9b shown in FIG. 4 is constituted by including a structure provided by connecting a conductor 54 to a conductor 53 and connecting a conductor 55 to it to thereby shorten a distance to the grounding conductor 28, and this is served as an input coupling capacitor structure 90b. Then, as shown in FIGS. 18A and 18B, the left-handed filter of the present preferred embodiment is constituted by connecting the terminal 201 of the CRLH resonator structure 200a with the conductor 52b of the input coupling capacitor structure 70b, connecting the conductor 53 of the interstage coupling capacitor 90b in series to the terminal 202 of the CRLH resonator structure 200a, further connecting the conductor 53 of the interstage coupling capacitor 90b in series to the terminal 202 of a newly prepared CRLH resonator structure 200a and connecting the terminal 201 of the CRLH resonator structure 200a with the conductor 52a of the output coupling capacitor structure 80b.

Although the present preferred embodiment is constituted by including the input coupling capacitor 7b, the output coupling capacitor 8b and the interstage coupling capacitor 9b according to the above description, a similar effect can be obtained by constituting at least one of them of a capacitor and constituting the other components of an inductor. In this case, since the capacitor can be generally constituted with a low loss, the capacitor is more desirable.

Third Preferred Embodiment

A left-handed filter according to the third preferred embodiment of the present invention is described below with reference to the drawings.

Figure 5:
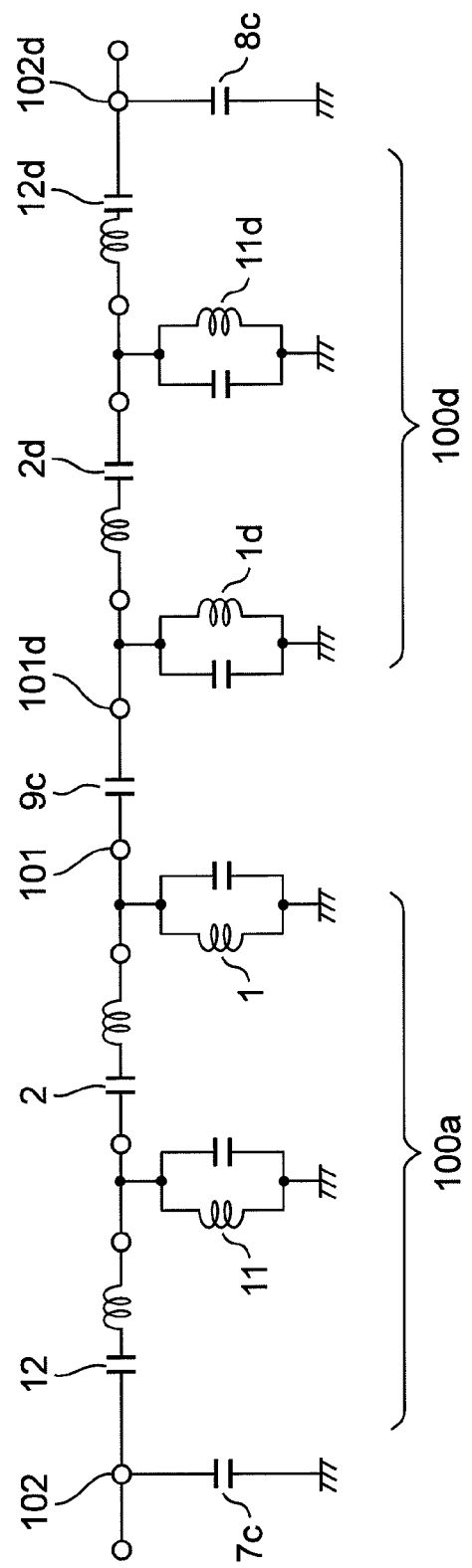
FIG. 5 is an equivalent circuit diagram of a left-handed filter according to a third preferred embodiment of the present invention.

As shown in FIG. 5, the present preferred embodiment is constituted by connecting an input coupling capacitor 7c between the terminal 102 of the CRLH resonator 100a and a grounding plane, connecting an interstage coupling capacitor 9c in series to the terminal 101 of the CRLH resonator 100a, further connecting the interstage coupling capacitor 9c in series to a terminal 101d of a newly prepared CRLH resonator 100d and connecting an output coupling capacitor 8c between a terminal 102d of the CRLH resonator 100d and a grounding plane. That is, the configuration includes a first capacitor 2, a first inductor 1 whose one end is connected to one end of the first capacitor 2 and another end is connected to the ground, a second capacitor 12 whose one end is connected to another end of the first capacitor 2, a second inductor 11 whose one end is connected to one end of the second capacitor 12 and another end is connected to the ground, an interstage coupling capacitor 9c served as an interstage coupling element whose one end is connected to one end of the first capacitor 2, a third capacitor 2d whose one end is connected to another end of the interstage coupling capacitor 9c, a third inductor 1d whose one end is connected to one end of the third capacitor 2d and another end is connected to the ground, a fourth capacitor 12d whose one end is connected to another end of the third capacitor 2d, a fourth inductor 11d whose one end is connected to one end of the fourth capacitor 12d and another end is connected to the ground, a first input and output coupling element 7c whose one end is connected to another end of the second capacitor 12 and another end is connected to the ground, and a second input and output coupling element 8c whose one end is connected to another end of the fourth capacitor 12d and another end is connected to the ground. The first capacitor 2 and the third capacitor 2d are arranged in symmetrical positions with respect to the interstage coupling capacitor 9c, and the second capacitor 12 and the fourth capacitor 12d are arranged in symmetrical positions with respect to the interstage coupling capacitor 9c. The first inductor 1 and the third inductor 1d are arranged in symmetrical positions with respect to the interstage coupling capacitor 9c, and the second inductor 11 and the fourth inductor 11d are arranged in symmetrical positions with respect to the interstage coupling capacitor 9c.

Since the CRLH resonators 100a and 100d are arranged in symmetrical positions with respect to the interstage coupling capacitor 9c as described above, coupling between the negative first-order resonances of the two CRLH resonators 100a and 100d can be easily controlled to allow the left-handed filter whose pass-band is formed of the negative first-order resonance to be constructed, and the left-handed filter compacter than the prior art two-stage left-handed filter can be provided by virtue of using the negative first order.

Figure 19A:
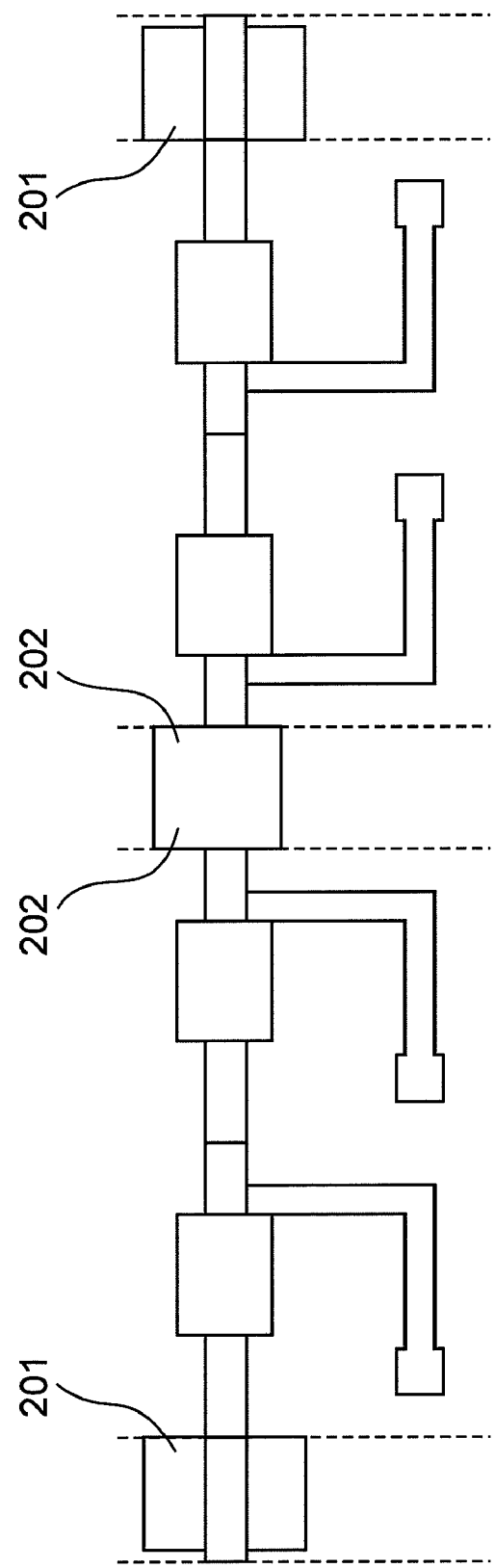
FIG. 19A is a top view showing a structure of the left-handed filter of the third preferred embodiment of the present invention.
Figure 19B:
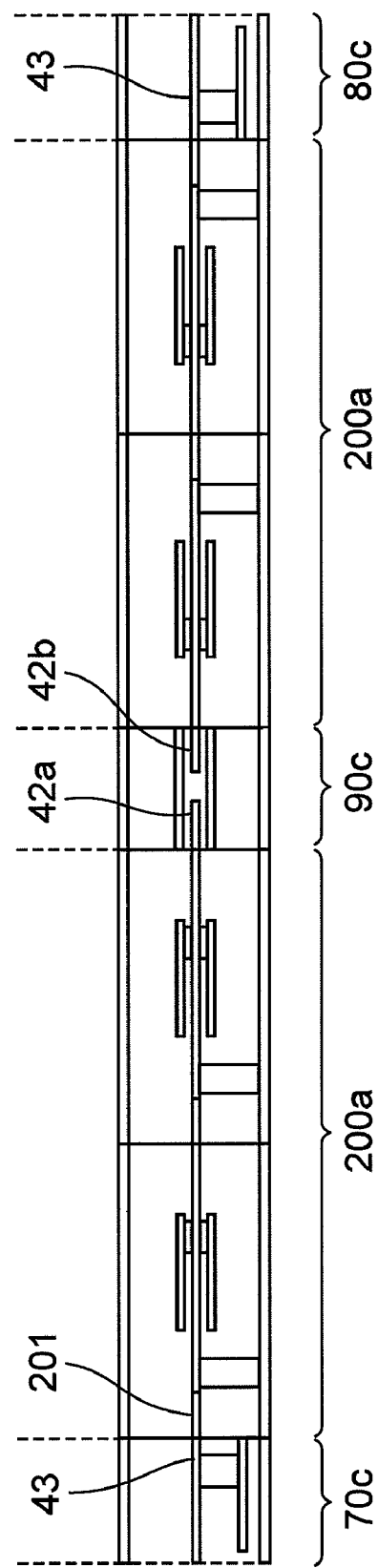
FIG. 19B is a side view showing a structure of the left-handed filter of the third preferred embodiment of the present invention.

A concrete configuration is described below. In the structure filled with the dielectric 29 between the grounding conductors 27 and 28 arranged to oppose each other as shown in FIGS. 13A and 13B, the interstage coupling capacitor 9c shown in FIG. 5 is constituted by sandwiching the conductors 42a and 42b between the conductors 41a and 41b, and this is served as an interstage coupling capacitor structure 90c. Moreover, in the structure filled with the dielectric 29 between the grounding conductors 27 and 28 arranged to oppose each other as shown in FIGS. 14A and 14B, the input coupling capacitor 7c is constituted by including a structure provided by connecting the conductor 44 to the conductor 43 and connecting the conductor 45 to it to thereby shorten the distance to the grounding conductor 28, and this is served as an input coupling capacitor structure 70c. The output coupling capacitor 8c is also constituted by including a structure similar to that of the input coupling capacitor structure 70c, and this is served as an output coupling capacitor structure 80c. Then, as shown in FIGS. 19A and 19B, the left-handed filter described in the present preferred embodiment is configured by connecting the terminal 201 of the CRLH resonator structure 200a with the conductor 43 of the input coupling capacitor structure 70c, connecting the conductor 42a of the interstage coupling capacitor structure 90c in series to the terminal 202 of the CRLH resonator structure 200a, further connecting the conductor 42b of the interstage coupling capacitor structure 90c in series to the terminal 202 of a newly prepared CRLH resonator structure 200a and connecting the terminal 201 of the CRLH resonator structure 200a with the conductor 43 of the output coupling capacitor structure 80c.

Although the present preferred embodiment is constituted by including the input coupling capacitor 7c, the output coupling capacitor 8c and the interstage coupling capacitor 9c according to the above description, a similar effect can be obtained by constituting at least one of them of a capacitor and constituting the other components of an inductor. In this case, since the capacitor can be generally constituted with a low loss, the capacitor is more desirable.

Fourth Preferred Embodiment

A left-handed filter according to the fourth preferred embodiment of the present invention is described below with reference to the drawings.

Figure 6:
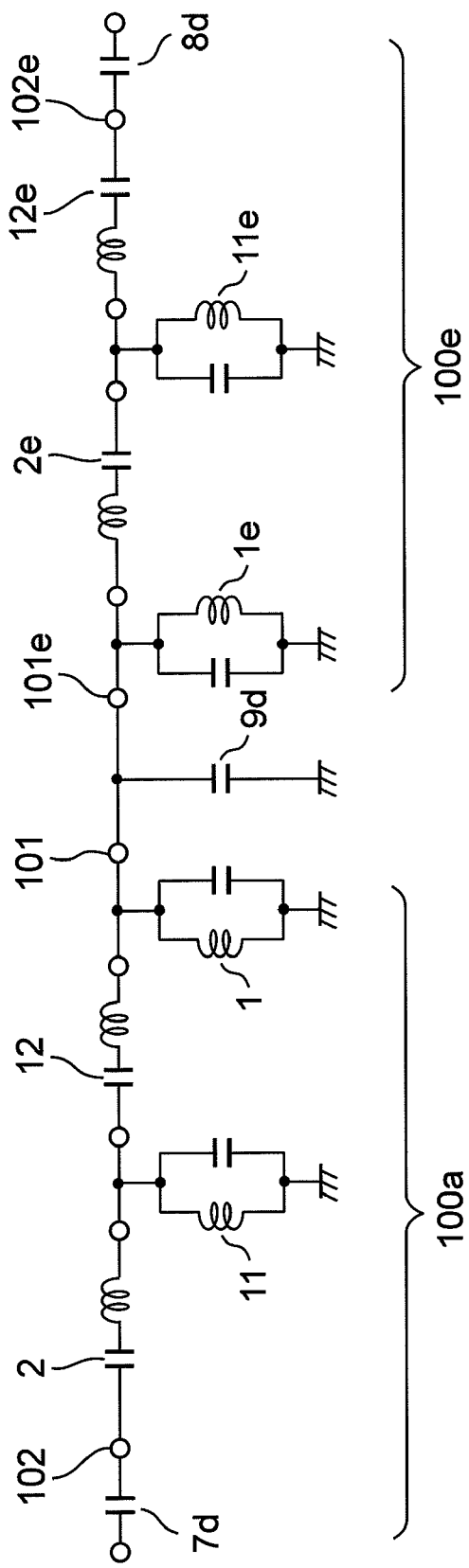
FIG. 6 is an equivalent circuit diagram of a left-handed filter according to fourth preferred embodiment of the present invention.

As shown in FIG. 6, the present preferred embodiment is constituted by connecting an input coupling capacitor 7d in series to the terminal 102 of the CRLH resonator 100a described in the first preferred embodiment, connecting an interstage coupling capacitor 9d between the terminal 101 of the CRLH resonator 100a and a grounding plane, connecting a terminal 101e of a newly prepared CRLH resonator 100e to the connection point of the CRLH resonator 100a and the interstage coupling capacitor 9d, and connecting an output coupling capacitor 8d in series to a terminal 102e of the CRLH resonator 100e. That is, the configuration includes a first capacitor 12, a first inductor 1 whose one end is connected to one end of the first capacitor 12 and another end is connected to the ground, a second capacitor 2 whose one end is connected to another end of the first capacitor 12, a second inductor 11 whose one end is connected to one end of the second capacitor 2 and another end is connected to the ground, an interstage coupling capacitor 9d served as an interstage coupling element whose one end is connected to one end of the first capacitor 12 and another end is connected to the ground, a third capacitor 2e whose one end is connected to one end of the interstage coupling capacitor 9d, a third inductor 1e whose one end is connected to one end of the third capacitor 2e and another end is connected to the ground, a fourth capacitor 12e whose one end is connected to another end of the third capacitor 2e, a fourth inductor 11e whose one end is connected to one end of the fourth capacitor 12e and another end is connected to the ground, a first input and output coupling element 7d whose one end is connected to another end of the second capacitor 2, and a second input and output coupling element 8d whose one end is connected to another end of the fourth capacitor 12e. The first capacitor 12 and the third capacitor 2e are arranged in symmetrical positions with respect to the interstage coupling capacitor 9d, and the second capacitor 2 and the fourth capacitor 12e are arranged in symmetrical positions with respect to the interstage coupling capacitor 9d. The first inductor 1 and the third inductor 1e are arranged in symmetrical positions with respect to the interstage coupling capacitor 9d, and the second inductor 11 and the fourth inductor 11e are arranged in symmetrical positions with respect to the interstage coupling capacitor 9d.

Since the CRLH resonators 100a and 100e are arranged in symmetrical positions with respect to the interstage coupling capacitor 9d as described above, coupling between the negative first-order resonances of the two CRLH resonators 100a and 100e can be easily controlled to allow the left-handed filter whose pass-band is formed of the negative first-order resonance to be constructed, and the left-handed filter compacter than the prior art two-stage left-handed filter can be provided by virtue of using the negative first order.

A concrete configuration is described below. In the structure filled with the dielectric 29 between the grounding conductors 27 and 28 arranged to oppose each other as shown in FIGS. 16A and 16B, the input coupling capacitor 7d shown in FIG. 6 is constituted by including a structure provided by sandwiching the conductors 52a and 52b shown in FIGS. 16A and 16B between conductors 51a and 51b, and this is served as an input coupling capacitor structure 70d. The output coupling element 8d shown in FIG. 6 is also constituted by including a structure similar to that of the input coupling capacitor structure 70d, and this is served as an output coupling capacitor structure 80d. Moreover, in the structure filled with the dielectric 29 between the grounding conductors 27 and 28 arranged to oppose each other as shown in FIGS. 17A and 17B, the interstage coupling capacitor 9d shown in FIG. 6 is constituted by including a structure provided by connecting the conductor 54 to the conductor 53 and connecting the conductor 55 to it to thereby shorten the distance to the grounding conductor 28, and this is served as an interstage coupling capacitor structure 90d. Then, as shown in FIGS. 20A and 20B, the left-handed filter of the present preferred embodiment is configured by connecting the terminal 201 of the CRLH resonator structure 200a with the conductor 42b of the input coupling capacitor structure 70d, connecting the conductor 53 of the interstage coupling capacitor structure 90d in series to the terminal 202 of the CRLH resonator structure 200a, further connecting the conductor 53 of the interstage coupling capacitor structure 90d in series to the terminal 202 of a newly prepared CRLH resonator structure 200a and connecting the terminal 201 of the CRLH resonator structure 200a with the conductor 42a of the output coupling capacitor structure 80d.

Although the present preferred embodiment is constituted by including the input coupling capacitor 7d, the output coupling capacitor 8d and the interstage coupling capacitor 9d according to the above description, a similar effect can be obtained by constituting at least one of them of a capacitor and constituting the other components of an inductor. In this case, since the capacitor can be generally constituted with a low loss, the capacitor is more desirable.

Although sufficient characteristics can be obtained even by the present preferred embodiment, since the values of the input coupling capacitor 7d and the output coupling capacitor 8d are very large and the value of the interstage coupling capacitor 9d is very small in designing, it is more difficult to concretely structurize them than in the first to third preferred embodiments, and therefore, the structures described in the first to third preferred embodiments are more desirable.

Fifth Preferred Embodiment

A left-handed filter according to the fifth preferred embodiment of the present invention is described below with reference to the drawings.

Figure 7:
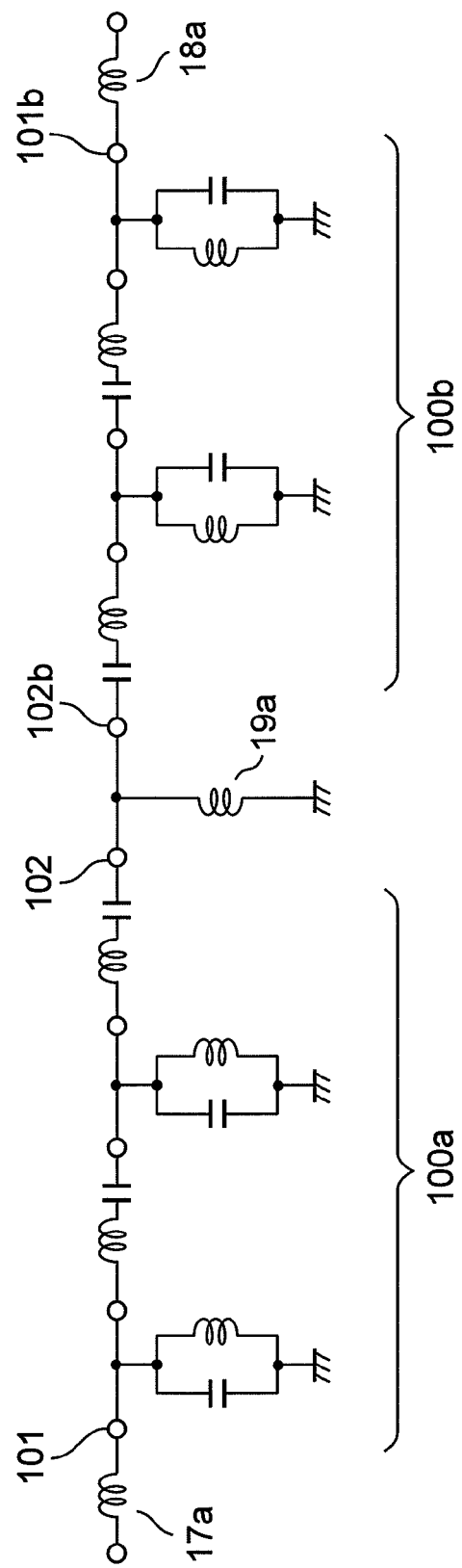
FIG. 7 is an equivalent circuit diagram of a left-handed filter according to a fifth preferred embodiment of the present invention.

As shown in FIG. 7, the present preferred embodiment is constituted by connecting an input coupling inductor 17a in series to the terminal 101 of the CRLH resonator 100a described in the first preferred embodiment, connecting an interstage coupling inductor 19a between the terminal 102 of the CRLH resonator 100a and a grounding plane, connecting a terminal 102b of a newly prepared CRLH resonator 100b to the connection point of the CRLH resonator 100a and the interstage coupling inductor 19a, and connecting an output coupling inductor 18a in series to the terminal 10b of the CRLH resonator 100b.

Since the CRLH resonators 100a and 100b are arranged in symmetrical positions with respect to the interstage coupling inductor 19a as described above, coupling between the negative first-order resonances of the two CRLH resonators 100a and 100b can be easily controlled to allow the left-handed filter whose pass-band is formed of the negative first-order resonance to be constructed, and the left-handed filter compacter than the prior art two-stage left-handed filter can be provided by virtue of using the negative first order.

Figure 21A:
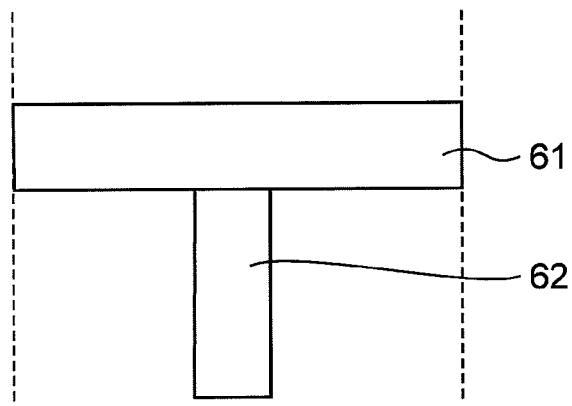
FIG. 21A is a top view showing a structure of an interstage coupling inductor in the left-handed filters of the fifth and seventh preferred embodiments of the present invention.
Figure 21B:
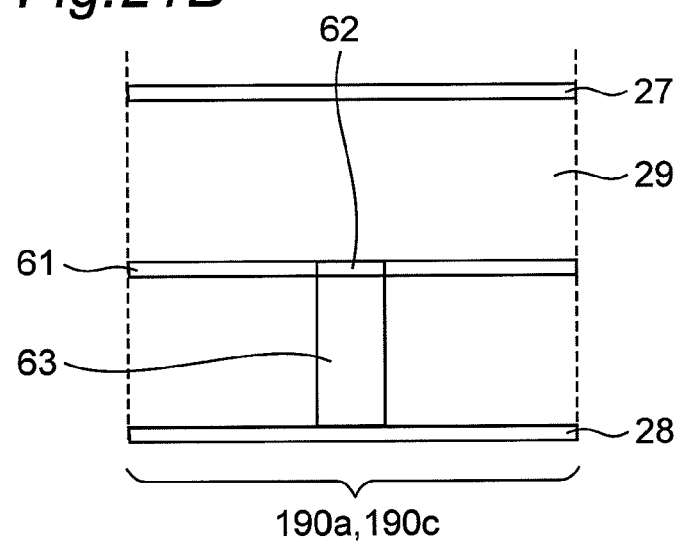
FIG. 21B is a side view showing a structure of the interstage coupling inductor in the left-handed filter of the fifth and seventh preferred embodiments of the present invention.
Figure 22A:
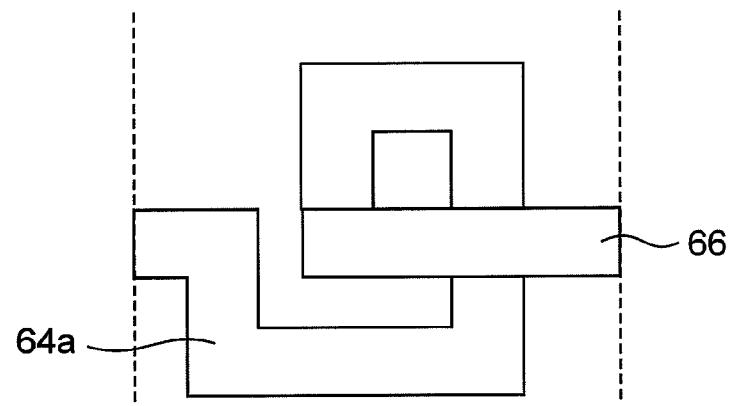
FIG. 22A is a top view showing a structure of an input coupling inductor and an output coupling inductor in the left-handed filters of the fifth and seventh preferred embodiments of the present invention.
Figure 22B:
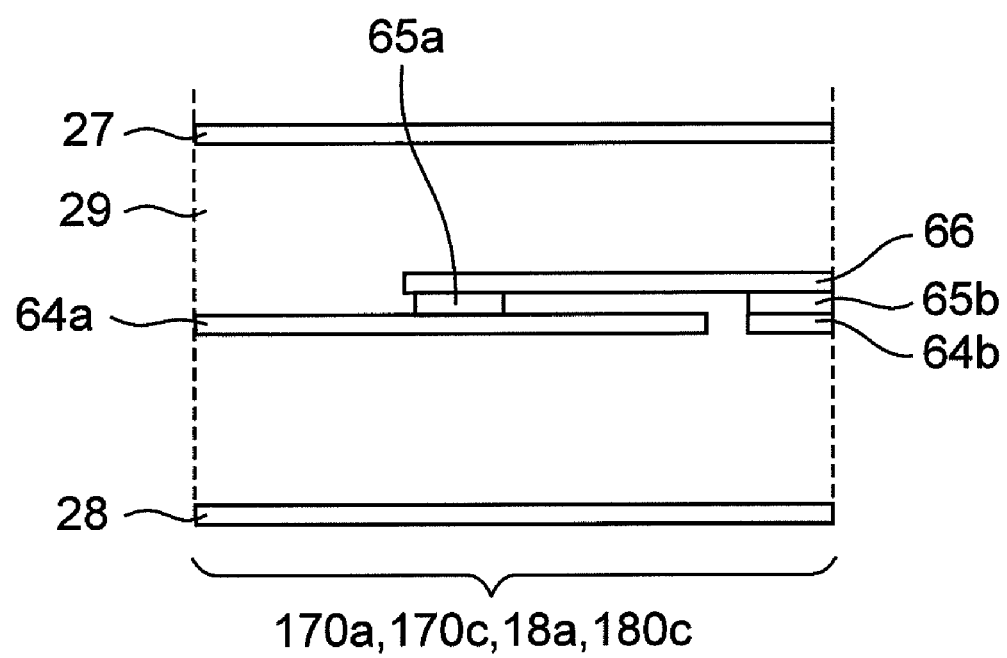
FIG. 22B is a side view showing a structure of the input coupling inductor and the output coupling inductor in the left-handed filters of the fifth and seventh preferred embodiments of the present invention.
Figure 23A:
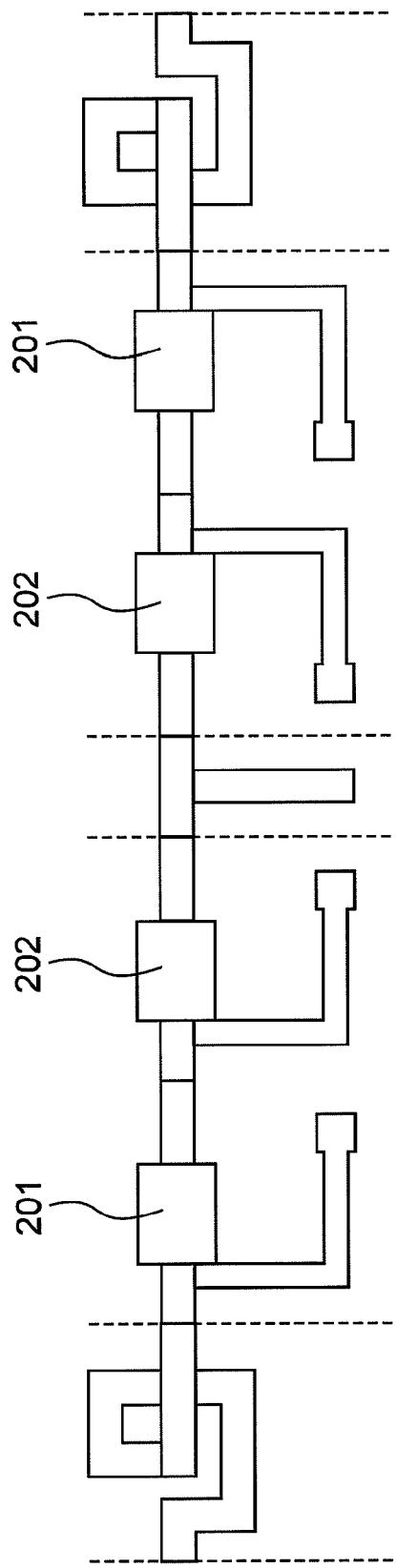
FIG. 23A is a top view showing a structure of the left-handed filter of the fifth preferred embodiment of the present invention.
Figure 23B:
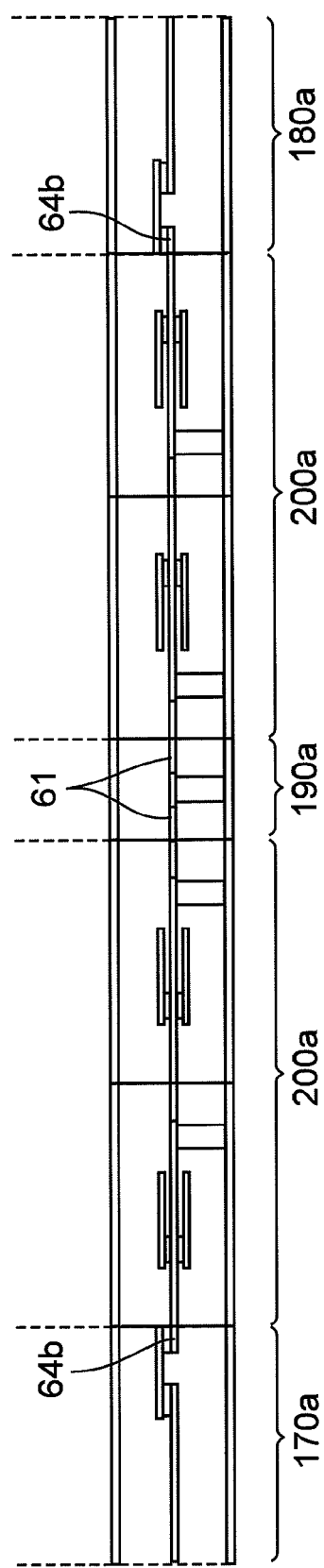
FIG. 23B is a side view showing a structure of the left-handed filter of the fifth preferred embodiment of the present invention.

A concrete configuration is described below. In the structure filled with the dielectric 29 between the grounding conductors 27 and 28 arranged to oppose each other as shown in FIGS. 21A and 21B, the interstage coupling inductor 19a shown in FIG. 7 is configured to include a conductor 62 connected to a conductor 61 and a conductor 63 arranged to connect the conductor 62 with the grounding conductor 28, and this is served as an interstage coupling inductor structure 190a. Moreover, in the structure filled with the dielectric 29 between the grounding conductors 27 and 28 arranged to oppose each other as shown in FIGS. 22A and 22B, in order to connect a spirally formed conductor 64a with a conductor 64b, the input coupling inductor 17a shown in FIG. 7 is constituted by including a structure provided by connecting the conductor 64a with a conductor 65a, connecting the conductor 65a with a conductor 66, connecting the conductor 66 with a conductor 65b and connecting the conductor 65b with the conductor 64b, and this is served as an input coupling inductor structure 170a. The output coupling inductor 18a shown in FIG. 7 is also constituted by including a structure similar to that of the input coupling inductor structure 170a, and this is served as an output coupling inductor structure 180a. Then, as shown in FIGS. 23A and 23B, the present preferred embodiment is constituted by connecting the terminal 201 of the CRLH resonator structure 200a with the conductor 64b of the input coupling inductor structure 170a, connecting the conductor 61 of the interstage coupling inductor structure 190a in series to the terminal 202 of the CRLH resonator structure 200a, further connecting the conductor 61 of the interstage coupling inductor structure 190a in series to the terminal 202 of a newly prepared CRLH resonator structure 200a and connecting the terminal 201 of the CRLH resonator structure 200a with the conductor 64b of the output coupling inductor structure 180a.

Although the present preferred embodiment is constituted by including the input coupling inductor 17a, the output coupling inductor 18a and the interstage coupling inductor 19a according to the above description, a similar effect can be obtained by constituting at least one of them of an inductor and constituting the other components of a capacitor. In this case, since the capacitor can be generally constituted with a low loss, the insertion loss of the left-handed filter is ameliorated.

Although sufficient characteristics can be obtained even by the present preferred embodiment, since a low-loss configuration can be generally achieved by a capacitor than by an inductor, the structures shown in the first to third preferred embodiments are more desirable.

Sixth Preferred Embodiment

A left-handed filter according to the sixth preferred embodiment of the present invention is described below with reference to the drawings.

Figure 8:
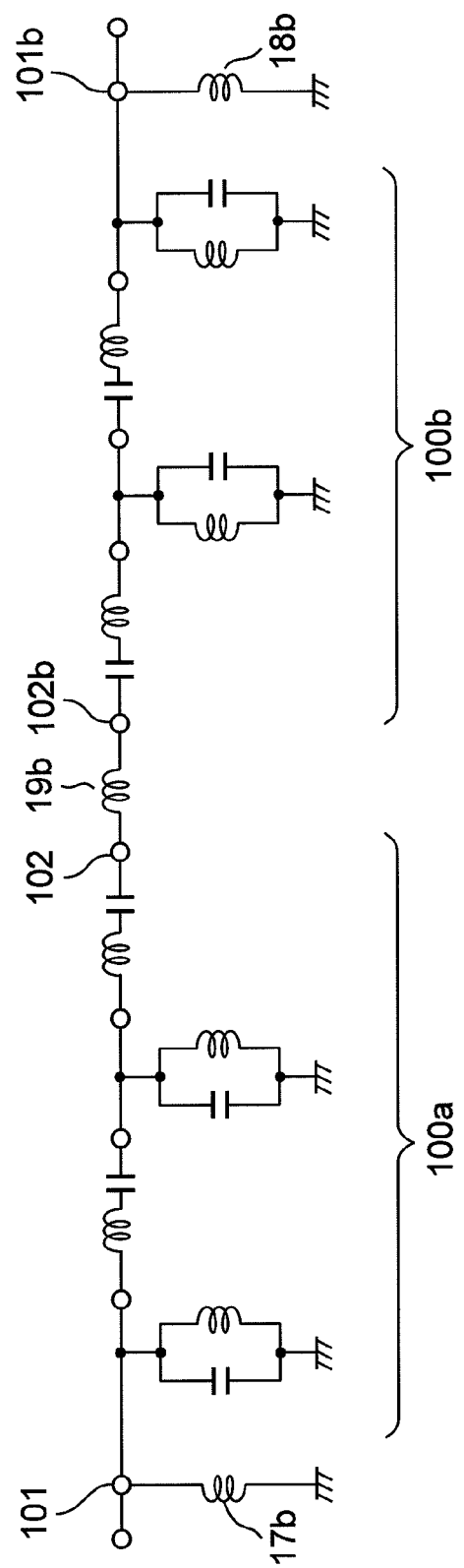
FIG. 8 is an equivalent circuit diagram of a left-handed filter according to a sixth preferred embodiment of the present invention.

As shown in FIG. 8, the present preferred embodiment is constituted by connecting an input coupling inductor 17b between the terminal 101 of the CRLH resonator 100a and a grounding plane, connecting an interstage coupling inductor 19b in series to the terminal 102 of the CRLH resonator 100a, further connecting the interstage coupling inductor 19b in series to the terminal 102b of a newly prepared CRLH resonator 100b and connecting an output coupling inductor 18b between the terminal 101b of the CRLH resonator 100b and the grounding plane.

Since the CRLH resonators 100a and 100b are arranged in symmetrical positions with respect to the interstage coupling inductor 19b as described above, coupling between the negative first-order resonances of the two CRLH resonators 100a and 100b can be easily controlled to allow the left-handed filter whose pass-band is formed of the negative first-order resonance to be constructed, and the left-handed filter compacter than the prior art two-stage left-handed filter can be provided by virtue of using the negative first order.

Figure 24A:
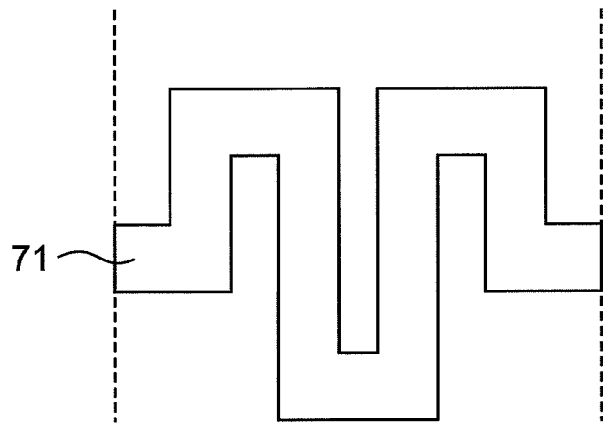
FIG. 24A is a top view showing a structure of an interstage coupling inductor in the left-handed filters of the sixth and eighth preferred embodiments of the present invention.
Figure 24B:
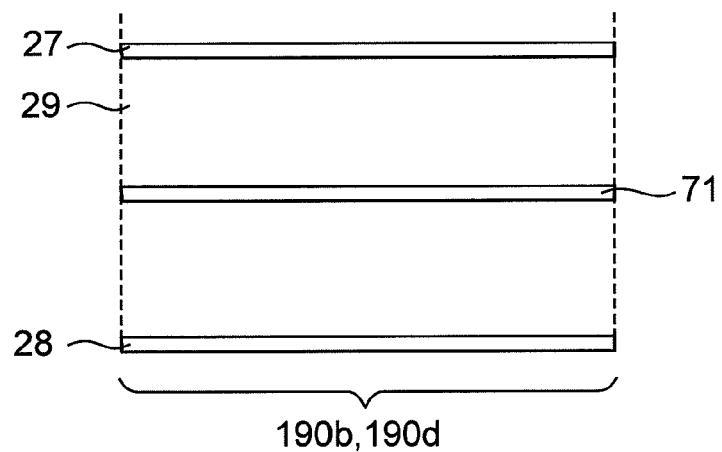
FIG. 24B is a side view showing a structure of the interstage coupling inductor in the left-handed filters of the sixth and eighth preferred embodiments of the present invention.
Figure 25A:
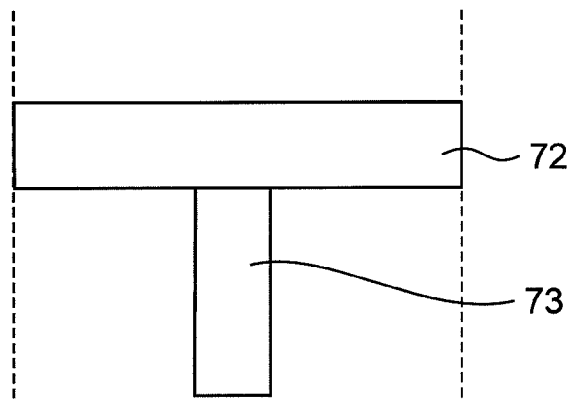
FIG. 25A is a top view showing a structure of the input coupling inductor and the output coupling inductor in the left-handed filters of the sixth and eighth preferred embodiments of the present invention.
Figure 25B:
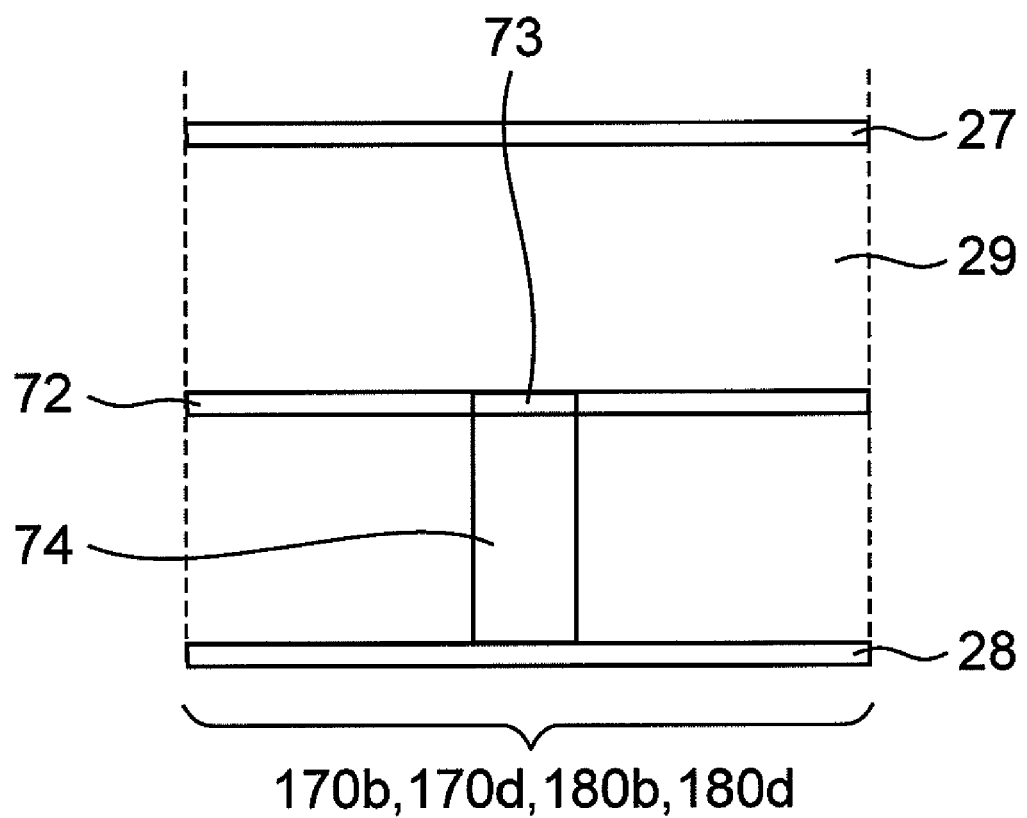
FIG. 25B is a side view showing a structure of the input coupling inductor and the output coupling inductor in the left-handed filters of the sixth and eighth preferred embodiments of the present invention.
Figure 26A:
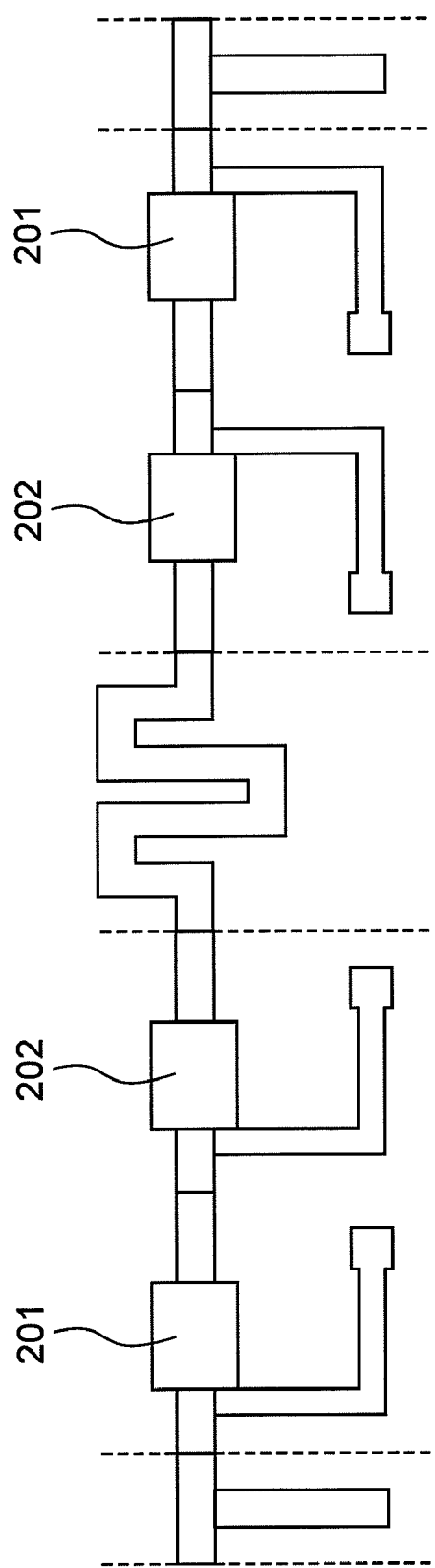
FIG. 26A is a top view showing a structure of the left-handed filter of the sixth preferred embodiment of the present invention.
Figure 26B:
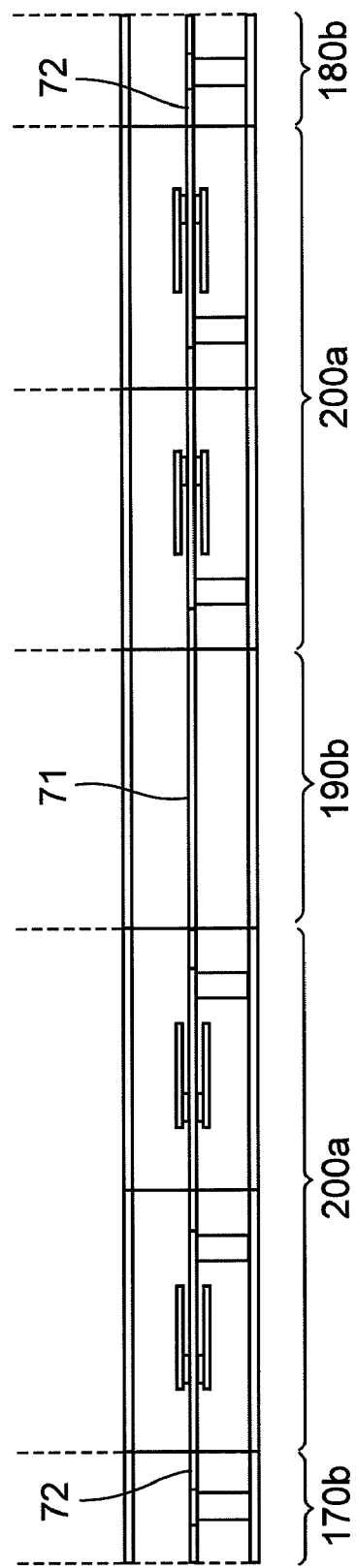
FIG. 26B is a side view showing a structure of the left-handed filter of the sixth preferred embodiment of the present invention.

A concrete configuration is described below. In the structure filled with the dielectric 29 between the grounding conductors 27 and 28 arranged to oppose each other as shown in FIGS. 24A and 24B, the interstage coupling inductor 19b shown in FIG. 8 is configured by a conductor 71 formed in a meander shape, and this is served as an interstage coupling inductor structure 190b. Moreover, in the structure filled with the dielectric 29 between the grounding conductors 27 and 28 arranged to oppose each other as shown in FIGS. 25A and 25B, the configuration of a conductor 73 connected to a conductor 72 of the input coupling inductor 17b shown in FIG. 8 and a conductor 74 arranged to connect the conductor 73 with the grounding conductor 28 is provided, and this is served as an input coupling inductor structure 170b. The output coupling inductor 18b shown in FIG. 8 is also constituted by including a structure similar to that of the input coupling inductor structure 170b, and this is served as an output coupling inductor structure 180b. Then, as shown in FIGS. 26A and 26B, the present preferred embodiment is configured by connecting the terminal 201 of the CRLH resonator structure 200a with the conductor 72 of the input coupling inductor structure 170b, connecting the conductor 71 of the interstage coupling inductor structure 190b in series to the terminal 202 of the CRLH resonator structure 200a, further connecting the conductor 71 of the interstage coupling inductor structure 190b in series to the terminal 202 of a newly prepared CRLH resonator structure 200a and connecting the terminal 201 of the CRLH resonator structure 200a with the conductor 72 of the output coupling inductor structure 180b.

Although the present preferred embodiment is constituted by including the input coupling inductor 17b, the output coupling inductor 18b and the interstage coupling inductor 19b according to the above description, a similar effect can be obtained by constituting at least one of them of an inductor and constituting the other components of a capacitor. Further, since the capacitor can be generally constituted with a low loss, the insertion loss of the left-handed filter is ameliorated.

Although sufficient characteristics can be obtained even by the present preferred embodiment, since a low-loss configuration can be generally achieved by a capacitor than by an inductor, the structures shown in the first to third preferred embodiments are more desirable.

Seventh Preferred Embodiment

A left-handed filter according to the seventh preferred embodiment of the present invention is described below with reference to the drawings.

Figure 9:
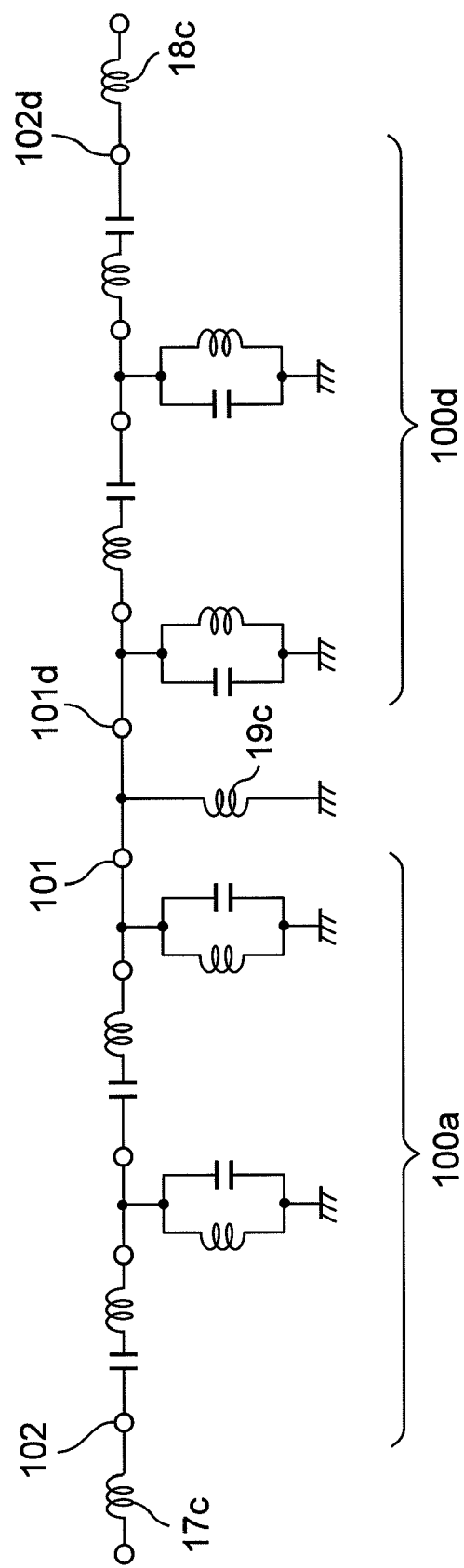
FIG. 9 is an equivalent circuit diagram of a left-handed filter according to a seventh preferred embodiment of the present invention.

As shown in FIG. 9, the present preferred embodiment is constituted by connecting an input coupling inductor 17c in series to the terminal 102 of the CRLH resonator 100a described in the first preferred embodiment, connecting an interstage coupling inductor 19c is connected between the terminal 101 of the CRLH resonator 100a and a grounding plane, connecting a terminal 101d of a newly prepared CRLH resonator 100d to the connection point of the CRLH resonator 100a and the interstage coupling inductor 19c, and connecting an output coupling inductor 18c in series to the terminal 102d of the CRLH resonator 100d.

Since the CRLH resonators 100a and 100d are arranged in symmetrical positions with respect to the interstage coupling inductor 19c as described above, coupling between the negative first-order resonances of the two CRLH resonators 100a and 100d can be easily controlled to allow the left-handed filter whose pass-band is formed of the negative first-order resonance to be constructed, and the left-handed filter compacter than the prior art two-stage left-handed filter can be provided by virtue of using the negative first order.

Figure 27A:
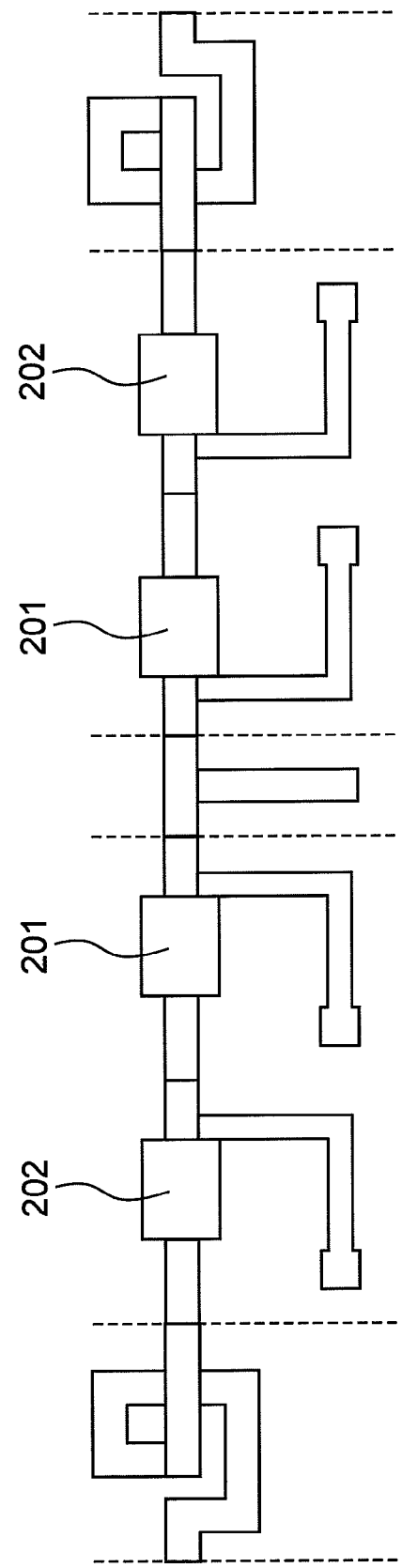
FIG. 27A is a top view showing a structure of the left-handed filter of the seventh preferred embodiment of the present invention.
Figure 27B:
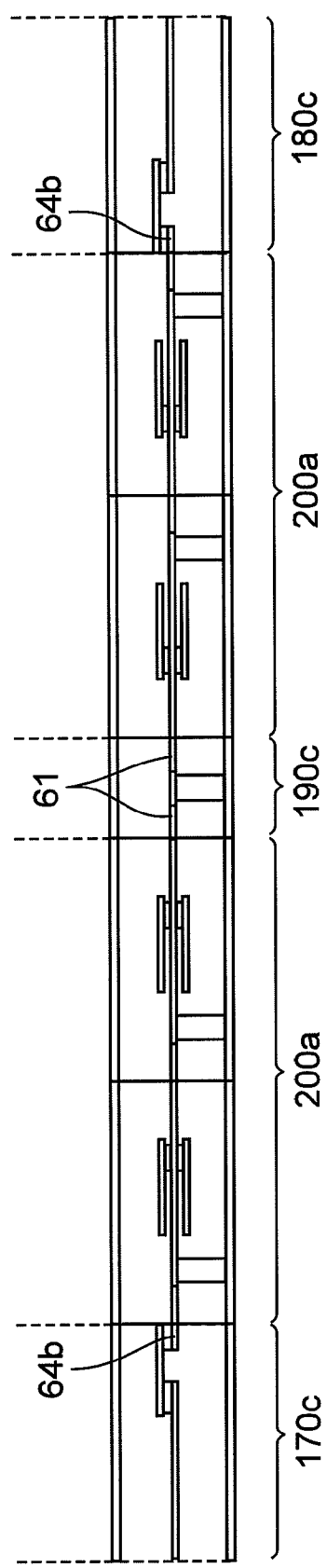
FIG. 27B is a side view showing a structure of the left-handed filter of the seventh preferred embodiment of the present invention.

A concrete configuration is described below. In the structure filled with the dielectric 29 between the grounding conductors 27 and 28 arranged to oppose each other as shown in FIGS. 21A and 21B, the interstage coupling inductor 19c shown in FIG. 9 is configured to include the conductor 62 connected to the conductor 61 and the conductor 63 arranged to connect the conductor 62 with the grounding conductor 28, and this is served as an interstage coupling inductor structure 190c. Moreover, in the structure filled with the dielectric 29 between the grounding conductors 27 and 28 arranged to oppose each other as shown in FIGS. 22A and 22B, in order to connect the spirally formed conductor 64a with the conductor 64b, the input coupling inductor 17c shown in FIG. 9 is constituted by including a structure provided by connecting the conductor 64a with the conductor 65a, connecting the conductor 65a with the conductor 66, connecting the conductor 66 with the conductor 65b and connecting the conductor 65b with the conductor 64b, and this is served as the input coupling inductor structure 170c. The output coupling inductor 18c is also constituted by including a structure similar to that of the input coupling inductor structure 170c, and this is served as an output coupling inductor structure 180c. Then, as shown in FIGS. 27A and 27B, the present preferred embodiment is constituted by connecting the terminal 202 of the CRLH resonator structure 200a with the conductor 64b of the input coupling inductor structure 170c, connecting the conductor 61 of the interstage coupling inductor structure 190c in series to the terminal 201 of the CRLH resonator structure 200a, further connecting the conductor 61 of the interstage coupling inductor structure 190c in series to the terminal 201 of a newly prepared CRLH resonator structure 200a and connecting the terminal 202 of the CRLH resonator structure 200a with the conductor 64b of the output coupling inductor structure 180c.

Although the present preferred embodiment is constituted by including the input coupling inductor 17c, the output coupling inductor 18c and the interstage coupling inductor 19c according to the above description, a similar effect can be obtained by constituting at least one of them of an inductor and constituting the other components of a capacitor. Further, since the capacitor can be generally constituted with a low loss, the insertion loss of the left-handed filter is ameliorated.

Although sufficient characteristics can be obtained even by the present preferred embodiment, since a low-loss configuration can be generally achieved by a capacitor than by an inductor, the structures shown in the first to third preferred embodiments are more desirable.

Eighth Preferred Embodiment

A left-handed filter according to the eighth preferred embodiment of the present invention is described below with reference to the drawings.

Figure 10:
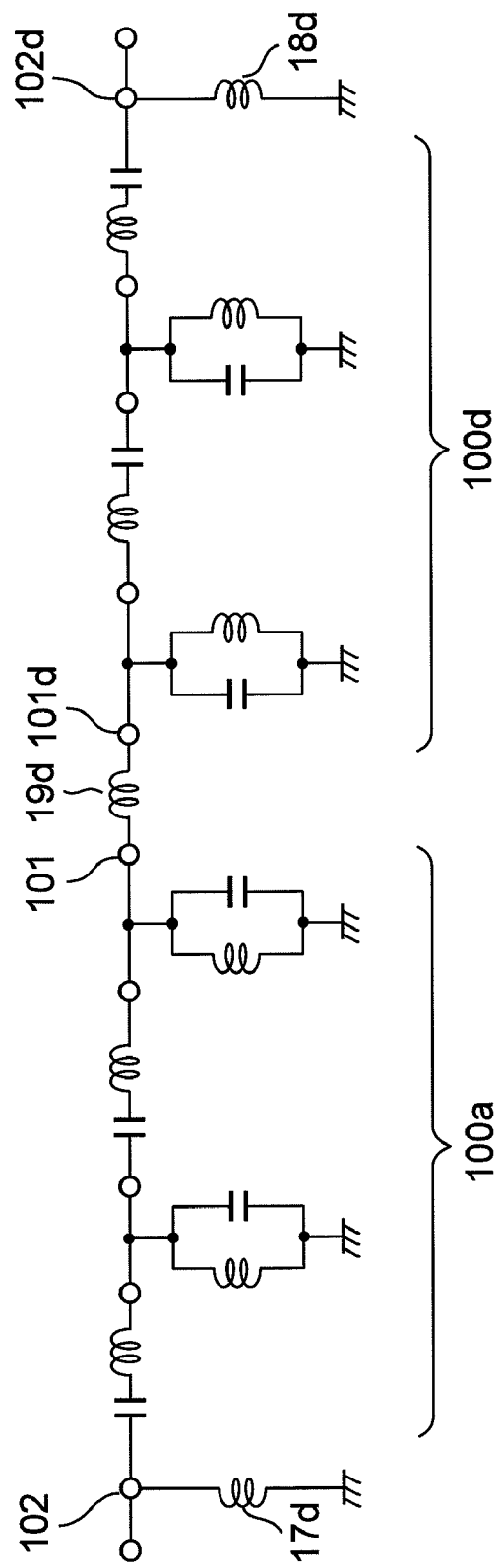
FIG. 10 is an equivalent circuit diagram of a left-handed filter according to an eighth preferred embodiment of the present invention.

As shown in FIG. 10, the present preferred embodiment is constituted by connecting an input coupling inductor 17d between the terminal 102 of the CRLH resonator 100a and a grounding plane, connecting an interstage coupling inductor 19d in series to the terminal 101 of the CRLH resonator 100a, further connecting the interstage coupling inductor 19b in series to the terminal 101d of a newly prepared CRLH resonator 100d and connecting an output coupling inductor 18d between the terminal 102d of the CRLH resonator 100b and the grounding plane.

Since the CRLH resonators 100a and 100d are arranged in symmetrical positions with respect to the interstage coupling inductor 19d as described above, coupling between the negative first-order resonances of the two CRLH resonators 100a and 100d can be easily controlled to allow the left-handed filter whose pass-band is formed of the negative first-order resonance to be constructed, and the left-handed filter compacter than the prior art two-stage left-handed filter can be provided by virtue of using the negative first order.

A concrete configuration is described below. In the structure filled with the dielectric 29 between the grounding conductors 27 and 28 arranged to oppose each other as shown in FIGS. 24A and 24B, the interstage coupling inductor 19d shown in FIG. 10 is configured to include a conductor 71 formed in a meander shape, and this is served as an interstage coupling inductor structure 190d. Moreover, in the structure filled with the dielectric 29 between the grounding conductors 27 and 28 arranged to oppose each other as shown in FIGS. 25A and 25B, the configuration of a conductor 73 connected to a conductor 72 of the input coupling inductor 17d shown in FIG. 10 and a conductor 74 arranged to connect the conductor 73 with the grounding conductor 28 is provided, and this is served as an input coupling inductor structure 170d. The output coupling inductor 18d shown in FIG. 10 is also configured by a structure similar to that of the input coupling inductor structure 170d, and this is served as an output coupling inductor structure 180d. Then, as shown in FIGS. 28A and 28B, the present preferred embodiment is configured by connecting the terminal 202 of the CRLH resonator structure 200a with the conductor 72 of the input coupling inductor structure 170d, connecting the conductor 71 of the interstage coupling inductor structure 190d in series to the terminal 201 of the CRLH resonator structure 200a, further connecting the conductor 71 of the interstage coupling inductor structure 190d in series to the terminal 201 of a newly prepared CRLH resonator structure 200a and connecting the terminal 202 of the CRLH resonator structure 200a with the conductor 72 of the output coupling inductor structure 180d.

Although the present preferred embodiment is constituted by including the input coupling inductor 17d, the output coupling inductor 18d and the interstage coupling inductor 19d according to the above description, a similar effect can be obtained by constituting at least one of them of an inductor and constituting the other components of a capacitor. Further, since the capacitor can be generally constituted with a low loss, the insertion loss of the left-handed filter is ameliorated.

Although sufficient characteristics can be obtained even by the present preferred embodiment, since a low-loss configuration can be generally achieved by a capacitor than by an inductor, the structures shown in the first to third preferred embodiments are more desirable.

Ninth Preferred Embodiment

A left-handed filter according to the ninth preferred embodiment of the present invention is described below with reference to the drawings.

Figure 29:
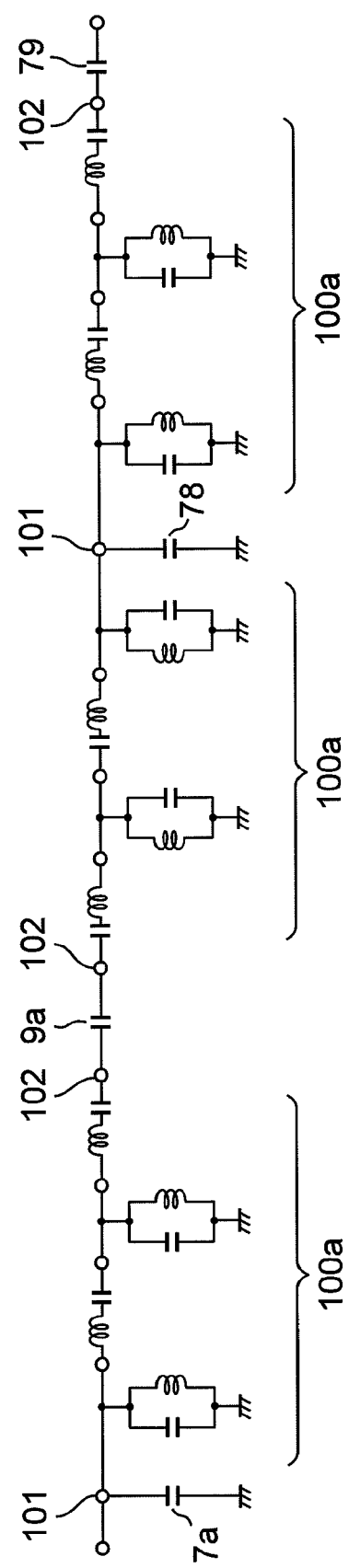
FIG. 29 is an equivalent circuit diagram of the left-handed filter of the ninth preferred embodiment of the present invention.

The present preferred embodiment is a left-handed filter that has three resonators obtained by further adding one CRLH resonator 100a to the left-handed filter that uses two CRLH resonators 100a described in the first preferred embodiment. In concrete, as shown in FIG. 29, in the equivalent circuit configuration of FIG. 3 described in the first preferred embodiment, the configuration is provided by using the output coupling capacitor 8a as an interstage coupling capacitor 78, connecting the terminal 101 of a newly prepared CRLH resonator 100a to the interstage coupling capacitor 78 and connecting an output coupling capacitor 79 between the terminal 102 of the CRLH resonator 100a and a grounding plane.

Since the CRLH resonators 100a are arranged in symmetrical positions with respect to the interstage coupling capacitor 9a and the interstage coupling capacitor 78 as described above, coupling between the negative first-order resonances of the three CRLH resonators 100a can be easily controlled to allow the left-handed filter whose pass-band is formed of the negative first-order resonance to be constructed, and the left-handed filter compacter than the prior art three-stage left-handed filter can be provided by virtue of using the negative first order.

It is noted that the structure described in the present preferred embodiment can be constituted by using a similar connection method also for the second to eighth preferred embodiments.

Figure 30B:
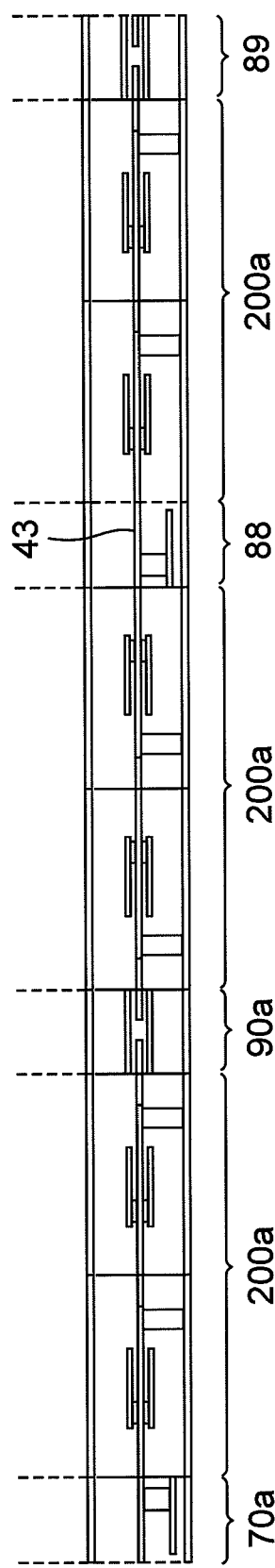
FIG. 30B is a side view showing a structure of the left-handed filter of the ninth preferred embodiment of the present invention.

As a concrete structural example, as shown in FIGS. 30A and 30B, in one example of the structure of FIGS. 15A and 15B described in the first preferred embodiment, the structure is provided by using the output coupling capacitor apparatus 80a as an interstage coupling capacitor structure 88, connecting the conductor 43 of the interstage coupling capacitor structure 88 to the terminal 201 of a newly prepared CRLH resonator structure 200a, and connecting the terminal 202 of the CRLH resonator structure 200a with an output coupling capacitor structure 89 shown in FIGS. 13A and 13B.

Although the present preferred embodiment is constituted by including the input coupling capacitor 7a, the output coupling capacitor 79, and the interstage coupling capacitors 9a and 78, a similar effect can be obtained by constituting at least one of them of a capacitor and constituting the other components of an inductor. In this case, since the capacitor can be generally constituted with a low loss, the capacitor is more desirable.

INDUSTRIAL APPLICABILITY

The left-handed filter of the present invention has such an effect that the propagation characteristics can be improved by widening the band in comparison with the prior art, and is useful in various electronic apparatuses such as mobile phones and the like.

The invention claimed is:

1. A left-handed filter comprising:
a first capacitor;
a second capacitor having one end connected to one end of the first capacitor;
a first inductor having one end connected to a connection point of the first capacitor and the second capacitor, and another end connected to a ground;
a second inductor having one end connected to another end of the second capacitor and another end connected to the ground;
an interstage coupling element having one end connected to another end of the first capacitor and another end connected to the ground;
a third capacitor having one end connected to one end of the interstage coupling element;
a fourth capacitor having one end connected to another end of the third capacitor;
a third inductor having one end connected to a connection point of the third capacitor and the fourth capacitor, and another end connected to the ground;
a fourth inductor having one end connected to another end of the fourth capacitor and another end connected to the ground;
a first input and output coupling element connected to another end of the second capacitor; and
a second input and output coupling element connected to another end of the fourth capacitor,
wherein the first capacitor and the third capacitor are arranged in symmetrical positions with respect to the interstage coupling element,
wherein the second capacitor and the fourth capacitor are arranged in symmetrical positions with respect to the interstage coupling element,
wherein the first inductor and the third inductor are arranged in symmetrical positions with respect to the interstage coupling element, and
wherein the second inductor and the fourth inductor are arranged in symmetrical positions with respect to the interstage coupling element.

2. A left-handed filter comprising:
a first capacitor;
a first inductor having one end connected to one end of the first capacitor and another end connected to a ground;
a second capacitor having one end connected to another end of the first capacitor;
a second inductor having one end connected to one end of the second capacitor and another end connected to the ground;
an interstage coupling element having one end connected to one end of the first capacitor;
a third capacitor having one end connected to another end of the interstage coupling element;
a third inductor having one end connected to one end of the third capacitor and another end connected to the ground;
a fourth capacitor having one end connected to another end of the third capacitor;
a fourth inductor having one end connected to one end of the fourth capacitor and another end connected to the ground;
a first input and output coupling element having one end connected to another end of the second capacitor and another end connected to the ground; and
a second input and output coupling element having one end connected to another end of the fourth capacitor and another end connected to the ground,
wherein the first capacitor and the third capacitor are arranged in symmetrical positions with respect to the interstage coupling element,
wherein the second capacitor and the fourth capacitor are arranged in symmetrical positions with respect to the interstage coupling element,
wherein the first inductor and the third inductor are arranged in symmetrical positions with respect to the interstage coupling element, and wherein the second inductor and the fourth inductor are arranged in symmetrical positions with respect to the interstage coupling element.

3. A left-handed filter comprising:

a first capacitor;

a second capacitor having one end connected to one end of the first capacitor;

a first inductor having one end connected to a connection point of the first capacitor and the second capacitor, and another end connected to the ground;

a second inductor having one end connected to another end of the second capacitor and another end connected to the ground;

an interstage coupling element having one end connected to another end of the first capacitor;

a third capacitor having one end connected to another end of the interstage coupling element;

a fourth capacitor having one end connected to another end of the third capacitor;

a third inductor having one end connected to a connection point of the third capacitor and the fourth capacitor, and another end connected to the ground;

a fourth inductor having one end connected to another end of the fourth capacitor and another end connected to the ground;

a first input and output coupling element having one end connected to another end of the second capacitor and another end connected to the ground; and a second input and output coupling element having one end connected to another end of the fourth capacitor and another end connected to the ground, wherein the first capacitor and the third capacitor are arranged in symmetrical positions with respect to the interstage coupling element, wherein the second capacitor and the fourth capacitor are arranged in symmetrical positions with respect to the interstage coupling element, wherein the first inductor and the third inductor are arranged in symmetrical positions with respect to the interstage coupling element, and wherein the second inductor and the fourth inductor are arranged in symmetrical positions with respect to the interstage coupling element.

4. A left-handed filter comprising:

a first capacitor;

a first inductor having one end connected to one end of the first capacitor and another end connected to a ground;

a second capacitor having one end connected to another end of the first capacitor;

a second inductor having one end connected to one end of the second capacitor and another end connected to the ground;

an interstage coupling element having one end connected to one end of the first capacitor and another end connected to the ground;

a third capacitor having one end connected to one end of the interstage coupling element;

a third inductor having one end connected to one end of the third capacitor and another end connected to the ground;

a fourth capacitor having one end connected to another end of the third capacitor;

a fourth inductor having one end connected to one end of the fourth capacitor and another end connected to the ground;

a first input and output coupling element having one end connected to another end of the second capacitor; and a second input and output coupling element having one end connected to another end of the fourth capacitor, wherein the first capacitor and the third capacitor are arranged in symmetrical positions with respect to the interstage coupling element, wherein the second capacitor and the fourth capacitor are arranged in symmetrical positions with respect to the interstage coupling element, wherein the first inductor and the third inductor are arranged in symmetrical positions with respect to the interstage coupling element, and wherein the second inductor and the fourth inductor are arranged in symmetrical positions with respect to the interstage coupling element.

* * * * *